(12) United States Patent
Yamamoto et al.

(10) Patent No.: US 6,621,170 B2
(45) Date of Patent: *Sep. 16, 2003

(54) SEMICONDUCTOR DEVICE, SUBSTRATE FOR MOUNTING SEMICONDUCTOR CHIP, PROCESSES FOR THEIR PRODUCTION, ADHESIVE, AND DOUBLE-SIDED ADHESIVE FILM

(75) Inventors: Kazunori Yamamoto, Tsukuba (JP); Yasushi Shimada, Tsukuba (JP); Yasushi Kumashiro, Shimodate (JP); Teiichi Inada, Shimodate (JP); Hiroyuki Kuriya, Shimodate (JP); Aizo Kaneda, Yokohama (JP); Takeo Tomiyama, Tsukuba (JP); Yoshihiro Nomura, Ichihara (JP); Yoichi Hosokawa, Tsukuba (JP); Hiroshi Kirihara, Ichihara (JP); Akira Kageyama, Niiza (JP)

(73) Assignee: Hitachi Chemical Company, Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/842,441

(22) Filed: Apr. 26, 2001

(65) Prior Publication Data

US 2001/0022404 A1 Sep. 20, 2001

Related U.S. Application Data

(63) Continuation of application No. 09/284,131, filed as application No. PCT/JP97/03618 on Oct. 8, 1997, now Pat. No. 6,265,782.

(30) Foreign Application Priority Data

Oct. 8, 1996 (JP) ............................................. 8-266460
Nov. 28, 1996 (JP) ............................................. 8-317709
Apr. 28, 1997 (JP) ............................................. 9-111430

(51) Int. Cl.$^7$ .................... H01L 23/48; H01L 23/52; H01L 29/40; B32B 27/38; B32B 7/12
(52) U.S. Cl. .................... 257/783; 257/782; 428/413; 428/414; 428/343; 428/354; 428/355 R; 428/355 EP; 156/330; 528/87
(58) Field of Search .................... 257/783, 782, 257/787; 428/413, 343, 354, 355 R, 355 EP, 414; 525/65, 107; 528/87; 156/330

(56) References Cited

U.S. PATENT DOCUMENTS

| 5,753,362 A | * | 5/1998 | Kawase et al. |
| 5,836,860 A | * | 11/1998 | Watanabe et al. ............ 492/56 |
| 6,121,553 A | * | 9/2000 | Shinada et al. |
| 6,184,577 B1 | * | 2/2001 | Takemura et al. |
| 6,225,418 B1 | * | 5/2001 | Satsu et al. |
| 6,265,782 B1 | * | 7/2001 | Yamamoto et al. ......... 257/783 |

FOREIGN PATENT DOCUMENTS

| EP | 0 823 729 | * | 2/1998 |
| JP | 60-243180 A | | 12/1985 |
| JP | 61-138680 A | | 6/1986 |
| JP | 04-042128 A | | 2/1992 |
| JP | 07-059617 B2 | | 4/1992 |
| JP | 07-059618 B2 | | 4/1992 |
| JP | 07-059619 B2 | | 4/1992 |
| JP | 07-059620 B2 | | 4/1992 |

(List continued on next page.)

*Primary Examiner*—Robert Dawson
*Assistant Examiner*—Michael J Feely
(74) *Attorney, Agent, or Firm*—Pennie & Edmonds LLP

(57) ABSTRACT

The present invention aims at an improvement in temperature-cycle resistance after packaging in semiconductor devices and also an improvement in moisture-absorbed reflow resistance, and provides an adhesive having a storage elastic modulus at 25° C. of from 10 to 2,000 MPa and a storage elastic modulus at 260° C. of from 3 to 50 MPa as measured with a dynamic viscoelastic spectrometer, and also a double-sided adhesive film, a semiconductor device and a semiconductor chip mounting substrate which make use of the adhesive, and their production process.

29 Claims, 5 Drawing Sheets

FOREIGN PATENT DOCUMENTS

| | | |
|---|---|---|
| JP | 07-064911 B2 | 4/1992 |
| JP | 07-068327 B2 | 4/1992 |
| JP | 06-204264 A | 7/1994 |
| JP | 06-218880 A | 8/1994 |
| JP | 06-256489 A | 9/1994 |
| JP | 06-256733 | 9/1994 |
| JP | 06-256733 A | 9/1994 |
| JP | 06-346030 | 12/1994 |
| JP | 06-346030 A | 12/1994 |
| JP | 07-076679 A | 3/1995 |
| JP | 07-173449 A | 7/1995 |
| JP | 07-242820 A | 9/1995 |
| JP | 08-113765 | 5/1996 |
| JP | 08-113765 A | 5/1996 |
| JP | 08-115997 A | 5/1996 |
| JP | 08-148815 A | 6/1996 |
| JP | 11-265960 * | 9/1999 |
| JP | 2000-100867 * | 2/2000 |

* cited by examiner

SEMICONDUCTOR DEVICE, SUBSTRATE FOR MOUNTING SEMICONDUCTOR CHIP, PROCESSES FOR THEIR PRODUCTION, ADHESIVE, AND DOUBLE-SIDED ADHESIVE FILM

This is a continuation of application Ser. No. 09/284,131, filed Aug. 30, 1999, now U.S. Pat. No. 6,265,782, published Jul. 24, 2001 which is a 371 of PCT/JP97/03618 filed Oct. 8, 1997.

TECHNICAL FIELD

This invention relates to a semiconductor device, a process for its fabrication, and a substrate for mounting a semiconductor chip used suitably in fabricating the semiconductor device, a process for its production, an adhesive, and a double-sided adhesive film.

BACKGROUND ART

In recent years, with miniaturization of electronic instruments and with a trend toward high-frequency operating, semiconductor packages to be mounted therein are required to package devices on a substrate in a high density. With progress of miniaturization and weight-saving, compact packages are being developed which are called micro-BGA (ball grid array) or CSP (chip-size package), external terminals of which are disposed in area array at the lower part of a package.

These packages employ a structure wherein chips are mounted on an organic substrate such as a glass epoxy substrate having a double-layer wiring structure or a polyimide substrate having a single-layer wiring structure, being mounted via an insulating adhesive, where chip-side terminals and wiring-board-side terminals are connected by an inner bonding process such as wire bonding or TAB (tape automated bonding), their connecting areas and chip top surfaces or perimeters are encapsulated with an epoxy type encapsulating material or an epoxy type liquid encapsulating material, and metallic terminals such as solder balls are disposed in area array on the back side surface of the wiring substrate. Then, these packages in plurality are one-time face-bonded on the substrate of an electronic instrument in a high density by solder reflowing. Such a method is being employed.

However, as an example of insulating adhesives used in these packages, an epoxy die-bonding material having a storage elastic modulus at 25° C. of 3,000 MPa or above as measured with a dynamic viscoelastic spectrometer is used, and its connection reliability at solder-ball connected areas (the secondary side) after the packages are mounted on the substrate is so poor as to result in a poor reliability on temperature-cycle resistance.

Moreover, in another example, a liquid silicone elastomer having a storage elastic modulus at 25° C. of 10 MPa or below is proposed as an insulating adhesive. It has a superior temperature-cycle resistance, but has a problem that it has a poor adhesion to the wiring substrate surface at the time of high temperature and a poor moisture-absorbed reflow resistance.

Especially in respect of reflow resistance, in the both examples, voids tend to be included in the course of coating a liquid insulating adhesive on the organic substrate, and faulty modes have been observed such that the voids serve as the starting point from which cracks develop or the organic substrate swells at the time of moisture-absorbed reflowing.

With progress of electronic instruments, electronic component parts are mounted in a higher density, and bare chip packaging on printed-wiring boards is put forward in expectation of a low cost.

As semiconductor chip packaging substrates, ceramic substrates of alumina or the like have been put into wide use. This is chiefly because, since semiconductor chips have a coefficient of thermal expansion of as small as about 4 ppm/° C., it has been required to use a packaging substrate having a relatively small coefficient of thermal expansion so that connection reliability can be ensured, and also it has been required to use a packaging substrate having a relatively high thermal conductivity so that the heat the semiconductor chips generate can be dissipated outside with ease. In the packaging of semiconductor chips on such a ceramic substrate, a liquid adhesive is used which is typified by silver paste.

Filmy adhesives are also used in flexible printed-wiring boards, and systems composed chiefly of acrylonitrile butadiene rubber are in wide use.

In studies on materials relating to printed-wiring boards, those improved in soldering thermal resistance after moisture absorption include an adhesive containing an acrylic resin, an epoxy resin, a polyisocyanate and an inorganic filler as disclosed in Japanese Patent Application Laid-open (KOKAI) No. 60-243180, and an adhesive containing an acrylic resin, an epoxy resin, a compound having a urethane linkage in the molecule and both terminals being primary amine, and an inorganic filler as disclosed in Japanese Patent Application Laid-open (KOKAI) No. 61-138680. These, however, have caused a great deterioration unsatisfactorily when tested on moisture resistance under severe conditions as in PCT (pressure cooker test) treatment.

The use of silver paste adhesives in the packaging of semiconductor chips on the ceramic substrate has had problems that the silver is not dispersed uniformly because of sedimentation of silver fillers, care must be taken for the storage stability of paste, and the operability of semiconductor chip packaging is inferior to LOC (lead-on chip).

The filmy adhesives, though they employ systems composed chiefly of acrylonitrile butadiene rubber are in wide use, have disadvantages that they may cause a great lowering of adhesion after treatment for a long time at a high temperature and have a poor electrolytic corrosion resistance. In particular, they have caused a great deterioration when tested on moisture resistance under severe conditions as in PCT treatment or the like used in an evaluation for reliability of a part associated with semiconductor.

Those disclosed in Japanese Patent Applications Laid-open (KOKAI) No. 60-243180 and No. 61-138680 have caused a great deterioration unsatisfactorily when tested on moisture resistance under severe conditions as in PCT treatment or the like.

These adhesives as materials relating to printed-wiring boards have not been usable because, when semiconductor chips are packaged on a printed-wiring board by the use of any of them, they have so great a difference in coefficient of thermal expansion between the semiconductor chips and the printed-wiring board as to cause cracks at the time of reflowing. They also have not been usable because of a great deterioration occurring when tested on moisture resistance under severe conditions as in temperature-cycle testing, PCT treatment or the like.

DISCLOSURE OF THE INVENTION

The present invention intends to provide an adhesive and an adhesive film which have thermal resistance, electrolytic corrosion resistance and moisture resistance required when semiconductor chips having a great difference in coefficient of thermal expansion are packaged on printed-wiring boards such as glass epoxy substrates or flexible substrates, and especially may less cause a deterioration when tested on moisture resistance under severe conditions as in PCT treatment or the like, and provides a semiconductor device in which a semiconductor chip has been bonded to a wiring board by the use of such an adhesive film.

The present invention also intends to provide, in a semiconductor device comprising an organic supporting substrate, a semiconductor chip mounted on the substrate via an adhesive and external terminals arranged in area array on the back of the substrate, a semiconductor device that can improve temperature-cycle resistance after packaging and also can improve moisture-absorbed reflow resistance, a process for fabricating such a semiconductor device, a semiconductor chip mounting substrate used suitably for fabricating the semiconductor device, a process for producing such a substrate, and also provides an adhesive and a double-sided adhesive film.

The semiconductor device of the present invention is a semiconductor device comprising an organic supporting substrate and a semiconductor chip mounted on the substrate via an adhesive member, in which wiring has been formed on the organic supporting substrate on its side on which the semiconductor chip is mounted, external connecting terminals have been formed in area array on the organic supporting substrate on its side opposite to the side on which the semiconductor chip is mounted, the wiring is connected with semiconductor chip terminals and the external connecting terminals, at least areas where the semiconductor chip terminal and the wiring are connected are encapsulated with a resin, and the adhesive member has a layer of an adhesive, and is characterized in that the adhesive has a storage elastic modulus at 25° C. of from 10 to 2,000 MPa and a storage elastic modulus at 260° C. of from 3 to 50 MPa as measured with a dynamic viscoelastic spectrometer.

The substrate for mounting the semiconductor chip of the present invention is a semiconductor chip mounting substrate comprising an organic substrate on which a semiconductor chip will be mounted via an adhesive member, in which wiring has been formed on the organic substrate on at least one of the side for mounting the semiconductor chip and the side opposite to the side for mounting the semiconductor chip, external connecting terminals are formed in area array on the organic substrate on its side opposite to the side for mounting the semiconductor chip, and the adhesive member has a layer of an adhesive, and is characterized in that a cured product of the adhesive has a storage elastic modulus at 25° C. of from 10 to 2,000 MPa and a storage elastic modulus at 260° C. of from 3 to 50 MPa as measured with a dynamic viscoelastic spectrometer; the adhesive member being formed at a prescribed place on the organic substrate in a prescribed size.

The process for producing the substrate according to the present invention for mounting the semiconductor chip comprises the step of thermocompression-bonding to a substrate an adhesive member film cut in a prescribed size; the substrate is an organic substrate on which wiring has been formed on at least one of the side on which semiconductor chip will be and the side opposite to the side on which the semiconductor chip will be and external connecting terminals are formed in area array on its side opposite to the side on which the semiconductor chip will be, and the adhesive member film is an adhesive member having a layer of an adhesive comprising as a cured product thereof a storage elastic modulus at 25° C. of from 10 to 2,000 MPa and a storage elastic modulus at 260° C. of from 3 to 50 MPa as measured with a dynamic viscoelastic spectrometer; the adhesive being in such a semi-cured state that its heat has been released by 10 to 40% of the total curing calorific value as measured with a DSC (differential scanning calorimeter).

The process for fabricating a semiconductor device according to the present invention comprises the steps of:

bonding to a semiconductor mounting substrate an adhesive member; the semiconductor mounting substrate is an organic substrate on which wiring has been formed on at least one of the side for mounting a semiconductor chip and the side opposite to the side for mounting the semiconductor chip and external connecting terminals are formed in area array on its side opposite to the side for mounting the semiconductor chips are mounted, and the adhesive member having an adhesive layer having as a cured product thereof a storage elastic modulus at 25° C. of from 10 to 2,000 MPa and a storage elastic modulus at 260° C. of from 3 to 50 MPa as measured with a dynamic viscoelastic spectrometer;

mounting the semiconductor chip via the adhesive member;

connecting the wiring to semiconductor chip terminals and the external connecting terminals; and encapsulating with a resin at least areas where the semiconductor chip terminals and the wiring are connected.

The adhesive of the present invention has any of the following composition A to D.

A. An adhesive comprising (1) 100 parts by weight of an epoxy resin and its curing agent inclusive, and based thereon (2) from 100 to 300 parts by weight of an epoxy-group-containing acrylic copolymer containing from 2 to 6% by weight of glycidyl (meth)acrylate and having a Tg (glass transition temperature) of −10° C. or above and a weight-average molecular weight of 800,000 or more and (3) from 0.1 to 5 parts by weight of a curing accelerator.

B. An adhesive comprising (1) 100 parts by weight of an epoxy resin and its curing agent inclusive, and based thereon (2) from 10 to 40 parts by weight of a high-molecular-weight resin compatible with the epoxy resin and having a weight-average molecular weight of 30,000 or more, (3) from 100 to 300 parts by weight of an epoxy-group-containing acrylic copolymer containing from 2 to 6% by weight of glycidyl (meth)acrylate and having a Tg (glass transition temperature) of −10° C. or above and a weight-average molecular weight of 800,000 or more and (4) from 0.1 to 5 parts by weight of a curing accelerator.

C. An adhesive comprising (1) 100 parts by weight of an epoxy resin and a phenol resin inclusive, and based thereon (2) from 100 to 300 parts by weight of an epoxy-group-containing acrylic copolymer containing from 2 to 6% by weight of glycidyl (meth)acrylate and having a Tg of −10° C. or above and a weight-average molecular weight of 800,000 or more and (3) from 0.1 to 5 parts by weight of a curing accelerator.

D. An adhesive comprising (1) 100 parts by weight of an epoxy resin and a phenol resin inclusive, and based thereon (2) from 10 to 40 parts by weight of a phenoxy resin, (3) from 100 to 300 parts by weight of an epoxy-group-containing acrylic copolymer containing from 2 to 6% by weight of glycidyl (meth)acrylate and having a Tg of −10° C. or above and a weight-average molecular weight of 800,000 or more and (4) from 0.1 to 5 parts by weight of a curing accelerator.

The double-sided adhesive film of the present invention has any of the following structure E to H.

E. A double-sided adhesive film of triple-layer structure comprising a heat-resistant thermoplastic film used as a core material, and having on both sides of the core material an adhesive comprising (1) 100 parts by weight of an epoxy resin and its curing agent inclusive, and based thereon (2) from 100 to 300 parts by weight of an epoxy-group-containing acrylic copolymer containing from 2 to 6% by weight of glycidyl (meth)acrylate and having a Tg (glass transition temperature) of −10° C. or above and a weight-average molecular weight of 800,000 or more and (3) from 0.1 to 5 parts by weight of a curing accelerator.

F. A double-sided adhesive film of triple-layer structure comprising a heat-resistant thermoplastic film used as a core material, and having on both sides of the core material an adhesive comprising (1) 100 parts by weight of an epoxy resin and its curing agent inclusive, and based thereon (2) from 10 to 40 parts by weight of a high-molecular-weight resin compatible with the epoxy resin and having a weight-average molecular weight of 30,000 or more, (3) from 100 to 300 parts by weight of an epoxy-group-containing acrylic copolymer containing from 2 to 6% by weight of glycidyl (meth)acrylate and having a Tg (glass transition temperature) of −10° C. or above and a weight-average molecular weight of 800,000 or more and (4) from 0.1 to 5 parts by weight of a curing accelerator.

G. A double-sided adhesive film of triple-layer structure comprising a heat-resistant thermoplastic film used as a core material, and having on both sides of the core material an adhesive comprising (1) 100 parts by weight of an epoxy resin and a phenol resin inclusive, and based thereon (2) from 100 to 300 parts by weight of an epoxy-group-containing acrylic copolymer containing from 2 to 6% by weight of glycidyl (meth)acrylate and having a Tg of −10° C. or above and a weight-average molecular weight of 800,000 or more and (3) from 0.1 to 5 parts by weight of a curing accelerator.

H. A double-sided adhesive film of triple-layer structure comprising a heat-resistant thermoplastic film used as a core material, and having on both sides of the core material an adhesive comprising (1) 100 parts by weight of an epoxy resin and a phenol resin inclusive, and based thereon (2) from 10 to 40 parts by weight of a phenoxy resin, (3) from 100 to 300 parts by weight of an epoxy-group-containing acrylic copolymer containing from 2 to 6% by weight of glycidyl (meth)acrylate and having a Tg of −10° C. or above and a weight-average molecular weight of 800,000 or more and (4) from 0.1 to 5 parts by weight of a curing accelerator.

In the semiconductor device of the present invention, the wiring can be connected directly to the semiconductor chip terminals by an inner bonding process such as wire bonding or TAB (tape automated bonding).

In the semiconductor device of the present invention, the adhesive member may preferably be in the form of a film. The adhesive member has an adhesive layer, and the adhesive used may have a resin component comprising an epoxy resin, an epoxy-group-containing acrylic copolymer, an epoxy resin curing agent and an epoxy resin curing accelerator.

The adhesive member may comprise a heat-resistant thermoplastic film used as a core material, having a glass transition temperature of 200° C. or above, such as a polyimide, polyether sulfone, polyamide-imide or polyether-imide film. It may preferably have a structure wherein the adhesive layer is formed on both sides of the core material. A liquid-crystal polymer film may also be used as the heat-resistant thermoplastic film. The adhesive layer may preferably have a residual solvent content not more than 5% by weight.

In the substrate of the present invention for mounting the semiconductor chip, the adhesive member may preferably be in the form of a film. The adhesive member has an adhesive layer, and the adhesive used may have a resin component comprising an epoxy resin, an epoxy-group-containing acrylic copolymer, an epoxy resin curing agent and an epoxy resin curing accelerator.

The adhesive member may comprise a heat-resistant thermoplastic film used as a core material, having a glass transition temperature of 200° C. or above, such as a polyimide, polyether sulfone, polyamide-imide or polyether-imide film. It may preferably have a structure wherein the adhesive layer is formed on both sides of the core material. A liquid-crystal polymer film may also be used as the heat-resistant thermoplastic film. The adhesive layer may preferably have a residual solvent content not more than 5% by weight.

As the adhesive member formed at a prescribed place on the organic substrate, a film may be used which has been punched with a punching die in a prescribed size. The adhesive member formed at the prescribed place on the organic substrate may be a film being an adhesive member comprising an adhesive of which is in such a semi-cured state that its heat has been released by 10 to 40% of the total curing calorific value as measured with a DSC. It may be thermocompression-bonded to the organic substrate after being cut in a prescribed size.

In the process for producing the substrate for mounting a semiconductor chip according to the present invention, the adhesive member film cut into film pieces is positioned precisely for each piece and thereafter bonded provisionally by hot pressing, and the adhesive member film pieces arranged in plurality are placed on a multi-framed organic substrate and thereafter pressed using a heated release surface-treated mold, thus they can be one-time bonded. The release surface-treated mold may preferably comprise a surface release material comprised of at least one of Teflon and silicone. Before the step of cutting the adhesive member film, at least one step may be added which is the step of static elimination to eliminate static electricity generated at the time of transport of the adhesive member film.

In the process for fabricating a semiconductor device according to the present invention, the semiconductor chip mounting substrate may be heated on both sides of the bottom side and the semiconductor chip side, and the heating temperature may be made higher at least on the semiconductor chip side.

In the adhesive of the present invention, the adhesive may preferably be used in such a state that its heat has been released by 10 to 40% of the total curing calorific value as measured with a DSC. It may preferably have as a cured product thereof a storage elastic modulus at 25° C. of from 10 to 2,000 MPa and a storage elastic modulus at 260° C. of from 3 to 50 MPa as measured with a dynamic viscoelastic spectrometer.

An inorganic filler may be used therein in an amount of from 2 to 20 parts by volume based on 100 parts by volume of the adhesive resin component. The inorganic filler may preferably be alumina or silica.

The adhesive may be provided on a base film to obtain an adhesive film. Using this adhesive film, the semiconductor chips may be bonded to the wiring board to obtain a semiconductor device.

In the double-sided adhesive film of the present invention, the adhesive may preferably be used in such a state that its heat has been released by 10 to 40% of the total curing calorific value as measured with a DSC. It may preferably have as a cured product thereof a storage elastic modulus at 25° C. of from 10 to 2,000 MPa and a storage elastic modulus at 260° C. of from 3 to 50 MPa as measured with a dynamic viscoelastic spectrometer. An inorganic filler may be used in an amount of from 2 to 20 parts by volume based on 100 parts by volume of the adhesive resin component. The inorganic filler may preferably be alumina or silica.

The heat-resistant thermoplastic film used as a core material may preferably have a glass transition temperature of 200° C. or above. Such a heat-resistant thermoplastic film having a glass transition temperature of 200° C. or above may preferably be a polyimide, polyether sulfone, polyamide-imide or polyether-imide film. A liquid-crystal polymer film may also be used as the heat-resistant thermoplastic film for a core material.

In order to solve the problems discussed in relation to the prior art, first a semiconductor package in which semiconductor chips were mounted on an organic wiring substrate via an insulating adhesive, semiconductor chip terminals and wiring substrate side terminals were connected by gold wire bonding and solder ball external terminals were arranged in area array on the back of the substrate, was examined by FEM elastoplastic analysis, on the relationship between physical properties of the insulating adhesive used therein and temperature-cycle resistance after mother board packaging.

As the result, the stress ascribable to a difference between the CTE (coefficient of linear thermal expansion; 3.5 ppm) of chips and the CTE (14 to 18 ppm) of mother board and applied to the solder ball external terminal areas of the substrate was found to decrease with a decrease in the modulus of elasticity E of the insulating adhesive and that, so long as the modulus of elasticity E as measured with a dynamic viscoelastic spectrometer was 2,000 MPa or below, and preferably 1,000 MPa or below, the corresponding stress of solder terminals at the outermost perimiters was sufficiently small and the package had a fatigue life of 1,000 cycles or more at a temperature cycle of from −55° C. to 125° C. even according to the Coffin-Manson law.

On the other hand, conventional epoxy type die bonding materials had a modulus of elasticity E of 3,000 MPa or above, and were found to have a problem on the reliability of temperature-cycle resistance of solder balls.

Meanwhile, if the insulating adhesive is made to have a modulus of elasticity E of 10 MPa or below which is substantially that of silicone elastomers, its modulus of elasticity E becomes so small as to exceed the measurement limit at the upper limit temperature 260° C. of reflow temperature to come to fall in the region where it no longer has the function as a strength member, so that the adhesion between the substrate surface and the silicon chips can no longer be expected to be maintained. The temperature dependence of adhesive strength under shear shows the same tendency as the temperature dependence of modulus of elasticity, and decreases with a rise of temperature. More specifically, no adhesive strength under shear can be expected unless the adhesive has a modulus of elasticity E of at least 3 MPa at the reflow temperature 260° C. Any separation occurring at its interface with the chips or substrate at the reflow temperature 260° C. leads to a fault of gold wire breakage or a fault of corrosion wire breakage in a temperature-cycle resistance test or a moisture resistance test, respectively, which are carried out later.

Thus, as the insulating adhesive (an adhesive cured product) used to mount a chip on the organic wiring substrate, the use of an adhesive having a modulus of elasticity at normal temperature within the range of from 10 to 2,000 MPa, preferably from 50 to 1,500 MPa, and most preferably from 100 to 1,000 MPa, and a modulus of elasticity at reflow temperature 260° C. within the range of from 3 to 50 MPa has been found to be conditioned on satisfactory temperature-cycle resistance and moisture-absorbed reflow resistance.

Investigation of various types of thermosetting resins having such a temperature dependence of modulus of elasticity has revealed that an epoxy-group-containing acrylic copolymer is a preferable adhesive that can materialize the physical properties within that range.

An additional factor causative of deterioration of moisture-absorbed reflow resistance is the occurrence of voids at the interface between the organic wiring substrate and the insulating adhesive. In usual systems in which a liquid thermosetting adhesive is coated dropwise in a small quantity, voids tend to be included to cause cracks at the time of moisture-absorbed reflowing or make the substrate swell.

Accordingly, the above epoxy-group-containing acrylic copolymer is formed into a film, and an adhesive film dried to have a residual solvent content not more than 5%, and preferably not more than 2%, and also brought into a B-stage cured state by 10 to 40% of the total curing calorific value as measured with a DSC (differential scanning calorimeter) is cut into a prescribed size, and then stuck onto the organic wiring substrate by hot pressing to obtain a semiconductor mounting substrate.

Thereafter, a chip is mounted and thermocompression-bonded, followed by the step of wire bonding and the step of encapsulating to obtain a package finished product.

The package thus obtained may hardly cause gaps or voids at the interface between the chip and the substrate. It has been found that the gaps can be made much less occur at the interface between the chip and the substrate when heat is applied on both sides, i.e., not only on the semiconductor mounting substrate side but also on the chip side, so that the resin fills the space between wiring areas on the substrate sufficiently to bring about an improvement in moisture-absorbed reflow resistance. It has also been found that the above adhesive film may be controlled to have a residual solvent content not more than 5%, and preferably not more than 2%, whereby no bubbles may occur in the course of curing of the adhesive film to cause no lowering of moisture-absorbed reflow resistance.

Application of the adhesive film having the above physical properties can be operative and effective alike not only for semiconductor packages in which terminals on the chip side and terminals on the wiring substrate side are connected by gold wire bonding and external terminals are arranged in area array on the back of the substrate, but also for packages in which terminals on the chip side and terminals on the wiring substrate side are connected by an inner bonding process such as TAB (tape automated bonding) (i.e., packages of a system in which terminals on the chip side and terminals on the wiring substrate side are connected directly). Thus, it satisfies both the temperature-cycle resistance and the moisture-absorbed reflow resistance of all area-array packages having the structure wherein semiconductor chips are bonded to an organic wiring substrate via an adhesive. The external connecting terminals are arranged in area array, i.e., arranged in a lattice over the whole area, or in a line or lines at peripheral areas, on the back of the substrate.

The organic wiring substrate may be any of FR-4 substrates such as a BT (bismaleimide) substrate and a glass epoxy substrate, and a polyimide film substrate, without limitations on substrate material. Also, the above adhesive film may be formed of a thermosetting adhesive having the above physical properties. It may also have a triple-layer structure comprising a polyimide film coated with the adhesive on its both sides. This has been found to be operative and effective like the above.

As a method of bonding the adhesive film to the organic wiring substrate, the adhesive film may be cut into given shapes, and film pieces obtained by cutting are positioned precisely and thermocompression-bonded to the organic wiring substrate.

The adhesive film may be cut by any methods so long as they are methods by which the film can be cut into given shapes. Taking account of operability and attachment, it is preferable for the adhesive film to be cut with a punching die, and thereafter compression-bonded provisionally, or compression-bonded mainly, to the organic wiring substrate.

The adhesive film thus cut is thermocompression-bonded to the organic wiring substrate by a method in which the adhesive film is cut into film pieces, which are thereafter attracted to a pressing member by suction to make precise registration, and then compression-bonded provisionally onto the organic wiring substrate, followed by main compression bonding by hot pressing, or a method in which the adhesive film is put to punching with a punching die and thereafter the punched film pieces are compression-bonded provisionally, followed by main compression bonding by hot pressing. When the punching die is used, another method is available in which tapes punched out with the punching die are put to main compression bonding as they are.

There are no particular limitations on conditions for the provisional compression bonding so long as adhesive tapes punched out can be bonded to the organic wiring substrate.

At the time of main compression bonding, the adhesive film may preferably be compression-bonded at a temperature of from 30 to 250° C., and more preferably from 70 to 150° C. At a compression bonding temperature below 30° C., the adhesive film may have so high a modulus of elasticity that not only the adhesive have a low adhesion but also undesirably the adhesive can not well fill the space around the wiring. At an adhesion temperature above 250° C., the wiring may be oxidized and the organic wiring substrate may become soft. This is undesirable in view of operability.

The main compression bonding may preferably be carried out at a pressure of from 1 to 20 kg/cm$^2$, and more preferably from 3 to 10 kg/cm$^2$. At a compression bonding pressure below 1 kg/cm$^2$, the adhesive film may have a poor adhesion and can not well fill the space around the wiring. At a pressure above 20 kg/cm$^2$, the adhesive may protrude out of the preset position to make the dimensional precision of the adhesive poor.

The main compression bonding may be carried out for any time during which the film can be bonded at the above compression bonding temperature and compression bonding time. Taking account of operability, it may preferably be carried out for 0.3 to 60 seconds, and more preferably 0.5 to 10 seconds.

A hot press used for the main compression bonding may preferably be surface-treated with a release agent so that the adhesive does not adhere to the press surface. In particular, those treated with Teflon or silicone are preferred in view of release properties and operability.

The epoxy resin used in the present invention may be any of those capable of curing to exhibit adhesive action. Preferably usable are epoxy resins of bifunctional or more having a molecular weight of less than 5,000, and more preferably less than 3,000. In particular, a liquid bisphenol A or bisphenol B resin having a molecular weight of 500 or less may be used. This is preferable because the fluidity at the time of lamination can be improved. The liquid bisphenol A or bisphenol B resin having a molecular weight of 500 or less is commercially available from Yuka Shell Epoxy K. K. under trade names EPIKOTE 807, EPIKOTE 827 and EPIKOTE 828. It is also commercially available from Dow Chemical Japan Ltd. under trade names D.E.R.330, D.E.R.331 and D.E.R.361. It is still also commercially available from Tohto Kasei Co., Ltd. under trade names YD128 and YDF170.

As the epoxy resin, a polyfunctional epoxy resin may also additionally be used for the purpose of making Tg (glass transition temperature) higher. Such a polyfunctional epoxy resin is exemplified by a phenol novolak epoxy resin and a cresol novolak epoxy resin.

The phenol novolak epoxy resin is commercially available from Nippon Kayaku Co., Ltd. under a trade name EPPN-201. Also, the cresol novolak epoxy resin is commercially available from Sumitomo Chemical Co., Ltd. under trade names ESCN-001 and ESCN-195, and is also commercially available from Nippon Kayaku Co., Ltd. under trade names EOCN1012, EOCN1025 and EOCN1027. As the epoxy resin, also usable are brominated epoxy resins, brominated bisphenol novolak epoxy resins (e.g., trade name: ESB-400; available from Sumitomo Chemical Co., Ltd.) and brominated phenol novolak epoxy resins (e.g., trade name: BREN-105, BREN-S; available from Nippon Kayaku Co., Ltd.).

As the curing agent for the epoxy resin, those conventionally used as curing agents for epoxy resins may be used, which may include amines, polyamides, acid anhydrides, polysulfides, trifluoroboron, and bisphenol A, bisphenol F and bisphenol S which are compounds having at least two phenolic hydroxyl groups in one molecule. In particular, phenol novolak resin, bisphenol novolak resin or cresol novolak resin which is phenol resin may preferably be used because of its superior electrolytic corrosion resistance at the time of moisture absorption.

Such curing agents considered preferable are commercially available from Dainippon Ink & Chemicals, Inc. under trade names PHENORITE LF2882, PHENORITE LF2822, PHENORITE TD-2090, PHENORITE TD-2149, PHENORITE VH4150 and PHENORITE VH4170. As the curing agent, a bromophenol compound tetrabromobisphenol A (trade name: FIREGUARD FG-2000; available from Teijin Chemicals Ltd.) may also be used.

A curing accelerator may preferably be used in combination with the curing agent. As the curing accelerator, it is preferable to use imidazoles of various types. The imidazoles may include 2-methylimidazole, 2-ethyl-4-methylimidazole, 1-cyanoethyl-2-phenylimidazole and 1-cyanoethyl-2-phenylimidazolium trimellitate.

The imidazoles are commercially available from Shikoku Chemicals Corp. under trade names 2E4MZ, 2PZ-CN and 2PZ-CNS.

The high-molecular-weight resin compatible with the epoxy resin and having a weight-average molecular weight of 30,000 or more may include phenoxy resins, high-molecular-weight epoxy resins, ultrahigh-molecular-weight epoxy resins, functional-group-containing rubbers with a great polarity and functional-group-containing reactive rubbers with a great polarity. This resin must have a weight-average molecular weight of 30,000 or more in order to make the adhesive less tacky at the B-stage and improve flexibility at the time of curing. The functional-group-containing rubbers with a great polarity may include rubbers obtained by adding a greatly polar functional group such as a carboxyl group to acrylic rubber. Here, what is meant by "compatible with the epoxy resin" is to have the property to form a homogeneous intimate mixture without separation from the epoxy resin into two or more phases after curing.

The phenoxy resins are commercially available from Tohto Kasei Co., Ltd. under trade names PHENOTOHTO YP-40, PHENOTOHTO YP-50 and PHENOTOHTO YP-60. The high-molecular-weight epoxy resins include high-molecular-weight epoxy resins having a molecular weight of from 300,000 to 800,000 and also ultrahigh-molecular-weight epoxy resins having a molecular weight of more than 800,000 (see Japanese Patent Puplications (KOKOKU) No. 7-59617, No. 7-59618, No. 7-59619, No. 7-59620, No. 7-64911 and No. 7-68327), all being products of Hitachi Chemical Co., Ltd. As the functional-group-containing reactive rubbers with a great polarity, carboxyl-group-containing acrylic rubber is commercially available from Teikoku Kagaku Sangyo Co., Ltd. under a trade name HTR-860P.

The high-molecular-weight resin compatible with the epoxy resin and having a weight-average molecular weight of 30,000 or more be added in an amount of 10 parts by weight or more in order to prevent shortage of flexibility of the phase composed chiefly of epoxy resin (hereinafter "epoxy resin phase"), decrease in tackiness and lowering of insulating properties because of cracks, and 40 parts by weight or less in order to prevent the epoxy resin phase having a low Tg.

As the epoxy-group-containing acrylic copolymer containing from 2 to 6% by weight of glycidyl (meth)acrylate and having a Tg of −10° C. or above and a weight-average molecular weight of 800,000 or more, HTR-860P-3, trade name, commercially available from Teikoku Kagaku Sangyo Co., Ltd. may be used. Use of a carboxylic acid type acrylic acid or a hydroxyl group type hydroxymethyl (meth) acrylate as a functional-group monomer is not preferable because cross-linking reaction tends to proceed to cause problems of gelling in the state of a varnish and lowering of adhesion due to a high degree of curing when standing in the B-stage. Also, the glycidyl (meth)acrylate used as a functional-group monomer may be in an amount of from 2 to 6% by weight in copolymer ratio. It be in an amount not less than 2% by weight in order to attain an adhesion (adhesive power), and in an amount not more than 6% by weight in order to prevent the rubber from gelling. The remainder may be comprised of ethyl (meth)acrylate or butyl (meth)acrylate or a mixture of the both, the mixing ratio of which is determined taking account of the Tg of the copolymer. If the copolymer has a Tg below −10° C., the adhesive film standing in the B-stage may have a high tackiness to make its handling properties poor, and hence the Tg be −10° C. or above. Polymerization may be carried out by a process including pearl polymerization and solution polymerization. Thus, the present copolymer can be obtained.

The epoxy-group-containing acrylic copolymer is required to have a weight-average molecular weight of 800,000 or more, within the range of which the product can less have a low strength or flexibility and a high tackiness when formed in sheets or films.

The epoxy-group-containing acrylic copolymer is required to be added in an amount not less than 100 parts by weight in order to prevent films from having a low strength or a high tackiness, and not more than 300 parts by weight because the addition of epoxy-group-containing acrylic rubber in a larger quantity makes the phase of rubber components more and the epoxy resin phase fewer to cause a lowering of handling properties at high temperature.

The adhesive may be compounded with a coupling agent in order to improve interfacial bonding between different materials. Such a coupling agent may preferably be a silane coupling agent.

The silane coupling agent may include γ-glycydoxypropyltrimethoxysilane, γ-mercaptopropyltrimethoxysilane, γ-aminopropyltriethoxysilane, γ-ureidopropyltriethoxysilane and N-β-aminoethyl-γ-aminopropyltrimethoxysilane.

The above silane coupling agent is commercially available from Nippon Unicar Co., Ltd. under trade names NUC A-187 for γ-glycydoxypropyltrimethoxysilane, NUC A-189 for γ-mercaptopropyltrimethoxysilane, NUC A-1100 for γ-aminopropyltriethoxysilane, NUC A-1160 for γ-ureidopropyltriethoxysilane, and NUC A-1120 for N-β-aminoethyl-γ-aminopropyltrimethoxysilane, any of which may preferably be used.

The coupling agent may preferably be compounded in an amount of from 0.1 to 10 parts by weight based on 100 parts by weight of the resin in view of the effect attributable to its addition and in view of thermal resistance and cost.

An ion entrapping agent may also be compounded in order to absorb ionic impurities to improve insulation reliability at the time of moisture absorption. Such an ion entrapping agent may preferably be compounded in an amount of from 5 to 10 parts by weight in view of the effect attributable to its addition and in view of thermal resistance and cost. The ion entrapping agent may include compounds known as copper-pollution preventive agents used to prevent copper from ionizing to dissolve out. For example, a triazine thiol compound or a bisphenol type reducing agent may be compounded. The bisphenol type reducing agent may include 2,2'-methylene-bis-(4-methyl-6-tertiary-butylphenol) and 4,4'-thio-bis-(3-methyl-6-tertiary-butylphenol).

The copper-pollution preventive agent comprised of the triazine thiol compound is commercially available from Sankyo Selyaku K.K. under a trade name ZISNET DB. The copper-pollution preventive agent comprised of the bisphenol type reducing agent is commercially available from Yoshitomi Pharmaceutical Industrial Co., Ltd. under a trade name YOSHINOX BB.

For the purposes of improving handling properties and thermal conductivity of the adhesive imparting flame retardance, adjusting melt viscosity, imparting thixotropic properties and improving surface hardness, an inorganic filler may preferably be further compounded in an amount of from 2 to 20 parts by volume based on 100 parts by volume of the adhesive resin component. It is compounded in an amount not less than 2 parts by volume in view of the effect of its addition, and in an amount not more than 20 parts by volume because its addition in a larger quantity may cause an increase in storage elastic modulus of the adhesive, a lowering of adhesion thereof and a lowering of electrical properties due to voids remaining therein.

The inorganic filler may include aluminum hydroxide, magnesium hydroxide, calcium carbonate, magnesium carbonate, calcium silicate, magnesium silicate, calcium oxide, magnesium oxide, alumina powder, aluminum nitride powder, aluminum borate whisker, boron nitride powder, crystalline silica and amorphous silica.

In order to improve thermal conductivity, alumina, aluminum nitride, boron nitride, crystalline silica and amorphous silica are preferred.

In particular, alumina is preferred in view of its good heat dissipation properties and good thermal resistance and insulating properties. The crystalline silica or amorphous silica is inferior to alumina in respect of heat dissipation properties, but contains ionic impurities in so small a quantity that it has high insulating properties at the time of PCT treatment, and is preferred in view of less causative of corrosion of copper foil, aluminum wires and aluminum sheets.

In order to impart flame retardance, aluminum hydroxide, magnesium hydroxide and antimony trioxide are preferred.

For the purpose of adjusting melt viscosity and imparting thixotropic properties, aluminum hydroxide, magnesium hydroxide, calcium carbonate, magnesium carbonate, calcium silicate, magnesium silicate, calcium oxide, magnesium oxide, alumina, crystalline silica and amorphous silica are preferred.

With regard to the improvement in surface hardness, short-fiber alumina and aluminum borate whisker are preferred.

The adhesive film of the present invention is obtained by dissolving or dispersing the adhesive components in a solvent to prepare a varnish, and coating the varnish on a base film, followed by heating to remove the solvent, to form an adhesive layer on the base film. As the base film, usable are plastic films such as polytetrafluoroethylene film, polyethylene terephthalate film, release-treated polyethylene terephthalate film, polyethylene film, polypropylene film, polymethylpentene film and polyimide film. The base film may be peeled when used and only the adhesive film may be used, or the base film may be used together and removed later.

As the plastic films used in the present invention, usable are, e.g., polyimide films such as KAPTON (trade name; available from Toray-Du Pont) and APIKAL (trade name; available from Kanegafuchi Chemical Industry Co., Ltd.), and polyethylene terephthalate films such as LUMIRROR (trade name; available from Toray-Du Pont) and PUREX (trade name; available from Teijin Limited).

As the solvent used to make up the varnish, it is preferable to use methyl ethyl ketone, acetone, methyl isobutyl ketone, 2-ethoxy ethanol, toluene, butyl cellosolve, methanol, ethanol, 2-methoxyethanol, or the like, having a relatively low boiling point. For the purpose of improving coating properties, a high-boiling solvent may also be added. The high-boiling solvent may include dimethylacetamide, dimethylformamide, methylpyrrolidone and cyclohexanone.

Taking account of dispersion of the inorganic filler, the varnish may be prepared using an automated mortar, a three-roll mill or a bead mill, or using any of these in combination. The filler and low-molecular-weight materials may be mixed previously and thereafter high-molecular-weight materials may be compounded, whereby the time taken for the mixing can be shortened. Also, after the varnish has been prepared, bubbles in the varnish may preferably be removed by vacuum deaeration.

The adhesive varnish may be coated on the base film such as plastic film, followed by heat drying to remove the solvent. The adhesive thus obtained is required to be in such a state that its heat has been released by 10 to 40% of the total curing calorific value as measured with a DSC. It is heated when the solvent is removed, and, during this heating, the adhesive composition undergoes curing reaction to gel. The state of curing at this stage influences the fluidity of the adhesive to make adhesion and handling properties favorable. DSC (differential scanning calorimetry) employs as a measurement principle a zero method in which calorific values are so fed or removed that the temperature difference from a standard sample causing neither exothermic nor endothermic changes is always cancelled within the range of measurement temperatures, and its measuring instruments are commercially available. The calorific value can be measured using any of them. The reaction of the resin composition is exothermic reaction, where the sample reacts to release heat with a rise of temperature of the sample at a controlled rate of temperature rise. Its calorific value is outputted on a chart, and the area surrounded by an exothermic curve and a base line is determined on the basis of the base line, and the resultant value is regarded as the calorific value. It is measured at a rate of temperature rise of 5 to 10° C./minute from room temperature to 250° C. to determine the above calorific value. These are performed fully automatically. Use of such a system enables the measurement with ease. Then, the calorific value of the adhesive obtained by coating on the base film followed by drying is determined in the following way. First, the total calorific value of an uncured sample from which the solvent has been dried off by a vacuum dryer at 25° C. is measured, and the value obtained is represented by A (J/g). Next, the calorific value of a sample coated with the adhesive and dried is measured, and the value obtained is represented by B. Degree of curing C (%) of the sample (in the state its heat has been released completely) is given by the following expression (1).

$$C(\%)=(A-B)\times 100/A \tag{1}$$

The adhesive of the present invention must have storage elastic moduli at 25° C. of from 20 to 2,000 MPa and at 260° C. of from 3 to 50 MPa, which are low moduli of elasticity, as measured with a dynamic viscoelastic spectrometer. The storage elastic modulus is measured in a temperature dependence measuring mode in which a tensile load is applied to an adhesive cured product (an adhesive whose heat has been released by 95 to 100% of the total curing calorific value as measured with a DSC) and its elasticity is measured at a frequency of 10 Hz and a rate of temperature rise of 5 to 10° C./minute from −50° C. to 300° C. An adhesive having a storage elastic modulus at 25° C. of more than 2,000 MPa may cause cracks because of its small effect of relaxing the stress produced at the time of reflowing due to the difference in coefficient of thermal expansion between the semiconductor chips and the printed-wiring board. On the other hand, an adhesive having a storage elastic modulus at 25° C. of less than 20 MPa may have poor handling properties. Thus, the adhesive may preferably have a storage elastic modulus at 25° C. of from 50 to 1,000 MPa.

The present invention is characteristic of a low modulus of elasticity at about room temperature, in the adhesive of a system comprised of the epoxy-group-containing acrylic copolymer and the epoxy resin. The epoxy-group-containing acrylic copolymer has a low modulus of elasticity at about room temperature. Hence, the use of the epoxy-group-containing acrylic copolymer in a large mixing ratio enables restraint of cracks on account of the effect of relaxing the stress produced at the time of reflowing due to the difference in coefficient of thermal expansion between the semiconductor chips and the printed-wiring board. Also, the epoxygroup-containing acrylic copolymer has an excellent reactivity with the epoxy resin. Hence, the adhesive cured product can be chemically and physically stable to exhibit superior performance in moisture resistance tests as typified by PCT treatment. Also, the measures as shown below have solved the problems concerning handling properties of conventional adhesive films, such as low adhesive film strength, low flexibility and high tackiness.

1) The epoxy-group-containing acrylic copolymer as specified in the present invention is used. This can restrain cracks from occurring at the time of reflowing.

2) The acrylic copolymer having a large molecular weight is used. This can ensure film strength and flexibility of the adhesive film even when the copolymer is added in a small quantity.

3) The high-molecular-weight resin compatible with the epoxy resin and having a weight-average molecular weight of 30,000 or more is used. This can promise a low tackiness.

Moreover, in the adhesive of the present invention, the epoxy resin and the high-molecular-weight resin are well compatible with each other to become homogeneous, and the epoxy group contained in the acrylic copolymer reacts with them in part, so that the whole inclusive of unreacted epoxy resin cross-links to become a gel, and hence it restrains fluidity, and by no means damages handling properties even when the epoxy resin and so forth are contained in a large quantity. Also, since the unreacted epoxy resin much remains in the gel, unreacted components ooze out of the gel when a pressure is applied. Hence, the adhesion may less decrease even when the whole has gelled.

Both the epoxy group contained in the epoxy-group-containing acrylic copolymer and the epoxy resin react when the adhesive is dried. Since the epoxy-group-containing acrylic copolymer has a large molecular weight and contains many epoxy groups in one molecular chain, the gelation takes place even when the reaction proceeds a little. Usually, the gelation takes place in the state the heat has been released by 10 to 40% of the total curing calorific value as measured with a DSC, i.e., at the first half stage of the A- or B-stage. Hence, the adhesive stands gelled in such a state that it contains unreacted components of the epoxy resin and so forth in a large quantity, and has come to have a greatly high melt viscosity compared with an instance where it has not gelled, so that its handling properties are by no means damaged. Also, since the unreacted components ooze out of the gel when a pressure is applied, the adhesion may less decrease even when the whole has gelled. Moreover, since the adhesive can be formed into a film in the state it contains unreacted components of the epoxy resin and so forth in a large quantity, the adhesive film has an advantage that it can have a long life (useful service life).

In conventional epoxy resin adhesives, the gelation takes place for the first time at the latter half of the B-stage and in the state of C-stage, and they contain unreacted components of the epoxy resin and so forth in a small quantity at the stage the gelation has taken place. Hence, they have a low fluidity and the unreacted components ooze out of the gel only in a small quantity even when a pressure is applied, so that they have a low adhesion.

Incidentally, the readiness of a reaction of the epoxy group contained in the acrylic copolymer and the epoxy group of the low-molecular-weight epoxy resin is unclear, but they may have at least the same level of reactivity. It is not required that only the epoxy group contained in the acrylic copolymer reacts selectively.

In this instance, the A-, B- and C-stages indicate degrees of curing of the adhesive. The A-stage is a state where it is substantially uncured and does not still gel, which is a state where its heat has been released by 0 to 20% of the total curing calorific value as measured with a DSC. The B-stage is a state where it has cured and gelled a little, which is a state where its heat has been released by 20 to 60% of the total curing calorific value. The C-stage is a state where it has cured and gelled considerably, which is a state where its heat has been released by 60 to 100% of the total curing calorific value.

To judge the extent of gelation, the adhesive is immersed in a solvent having a high permeability such as THF (tetrahydrofuran), which is then left at 25° C. for 20 hours, and thereafter the adhesive standing fully insoluble and swelled is judged to have gelled. In an experimental approach, it is judged in the following way.

The adhesive (weight W1) was immersed in THF, which was then left at 25° C. for 20 hours, and thereafter its insoluble matter was filtered with a nylon cloth of 200 meshes, and its weight after drying was measured (weight W2). THF percent extraction (%) was calculated according to the following expression (2). A sample having a THF percent extraction of more than 80% by weight was judged to have not gelled, and a sample having that of not more than 80% by weight, to have gelled.

THF percent extraction (% by weight)=(weight W1−weight W2)× 100/weight W1    (2)

In the present invention, the addition of the filler can make the adhesive have a higher melt viscosity and also exhibit thixotropic properties. Hence, it can make the above effect greater.

In addition to the above effect, it can improve heat dissipation properties of the adhesive, and can endow the adhesive with flame retardance, with a proper viscosity at temperature at the time of bonding and also with properties to improve surface hardness. A semiconductor device obtained by bonding semiconductor chips to a wiring board with the adhesive film of the present invention can be superior in reflow resistance, temperature-cycle resistance, electrolytic corrosion resistance and moisture resistance (PCT resistance).

The heat-resistant thermoplastic film used as a core material in the present invention may preferably be a film formed of a polymer or liquid-crystal polymer having a glass transition temperature Tg of 200° C. or above. Polyimide, polyether sulfone, polyamide-imide, polyether imide or a totally aromatic polyester may preferably be used. The film may preferably be used in a thickness ranging from 5 to 200 μm, but not limited thereto. Use of a heat-resistant thermoplastic film having a Tg below 200° C. is not preferable because it may cause plastic deformation at high temperature at the time of reflowing or the like.

As to the adhesive applied on both sides of the core material in the present invention, the components of the adhesive may be dissolved or dispersed in a solvent to prepare a varnish, and the varnish may be coated on the core material heat-resistant thermoplastic film, followed by heating to remove the solvent to form adhesive layers. By forming the adhesive layers on both sides of the core material heat-resistant thermoplastic film, a double-sided adhesive film having a triple-layer structure can be obtained. The adhesive on each side may be formed in a thickness ranging from 2 to 150 μm. If formed in a thickness smaller than 2 μm, the layer may have a poor adhesion or thermal stress relaxation effect. Its formation in a thickness larger than 150 μm is not economical, but not limited thereto.

Alternatively, the components of the adhesive may be dissolved or dispersed in a solvent to prepare a varnish, and the varnish may be coated on a base film, followed by heating to remove the solvent to prepare an adhesive film consisting of adhesive components, and this adhesive film consisting of adhesive components may be laminated to both sides of the core material heat-resistant thermoplastic film, thus a double-sided adhesive film having a triple-layer structure can also be obtained. Here, as the base film used to prepare the adhesive film consisting of adhesive components, usable are plastic films such as polytetrafluoroethylene film, polyethylene terephthalate film, release-treated polyethylene terephthalate film, polyethylene film, polypropylene film, polymethylpentene film and polyimide film. As the plastic films, usable are, e.g., polyimide films such as KAPTON (trade name; available from Toray-Du Pont) and APIKAL (trade name; available from Kanegafuchi Chemical Industry Co., Ltd.), and polyethylene terephthalate films such as LUMIRROR (trade name; available from Toray-Du Pont) and PUREX (trade name; available from Teijin Limited).

As the solvent used to make up the varnish, it is preferable to use methyl ethyl ketone, acetone, methyl isobutyl ketone, 2-ethoxy ethanol, toluene, butyl cellosolve, methanol, ethanol and 2-methoxyethanol, having a relatively low boiling point. For the purpose of improving coating properties, a high-boiling solvent may also be added. The high-boiling solvent may include dimethylacetamide, dimethylformamide, methylpyrrolidone and cyclohexanone.

Taking account of dispersion of the inorganic filler, the varnish may be prepared using an automated mortar, a three-roll mill or a bead mill, or using any of these in combination. The filler and low-molecular-weight materials may be mixed previously and thereafter high-molecular-weight materials may be compounded, whereby the time taken for the mixing can be shortened. Also, after the varnish has been prepared, bubbles in the varnish may preferably be removed by vacuum deaeration.

The above adhesive can be obtained by coating the adhesive varnish on the core material heat-resistant thermoplastic film or the base film such as plastic film, followed by heat drying to remove the solvent. The adhesive thus obtained may preferably be in such a state that its heat has been released by 10 to 40% of the total curing calorific value as measured with a DSC. It is heated when the solvent is removed, and, during this heating, the adhesive composition undergoes curing reaction to gel. The state of curing at this stage influences the fluidity of the adhesive to make adhesion and handling properties favorable. DSC (differential scanning calorimetry) employs as a measurement principle a zero method in which calorific values are so fed or removed that the temperature difference from a standard sample causing neither exothermic nor endothermic changes is always cancelled within the range of measurement temperatures, and its measuring instruments are commercially available. The calorific value can be measured using any of them. The reaction of the resin composition is exothermic reaction, where the sample reacts to release heat with a rise of temperature of the sample at a controlled rate of temperature rise. Its calorific value is outputted on a chart, and the area surrounded by an exothermic curve and a base line is determined on the basis of the base line, and the resultant value is regarded as the calorific value. It is measured at a rate of temperature rise of 5 to 10° C./minute from room temperature to 250° C. to determine the above calorific value. These are performed fully automatically. Use of such a system enables the measurement with ease.

The calorific value of the adhesive obtained by coating on the core material heat-resistant thermoplastic film or the base film followed by drying is determined in the following way. First, only the adhesive components are taken out and the total calorific value of an uncured sample from which the solvent has been dried off using a vacuum dryer at 25° C. is measured, and the value obtained is represented by A (J/g). Next, the calorific value of a sample coated with the adhesive and dried is measured, and the value obtained is represented by B. Degree of curing C (%) of the sample (in the state its heat has been released completely) is given by the following expression (1).

$$C(\%)=(A-B)\times 100/A \qquad (1)$$

The adhesive component of the present invention may preferably have storage elastic moduli at 25° C. of from 20 to 2,000 MPa and at 260° C. of from 3 to 50 MPa, which are low moduli of elasticity, as measured with a dynamic viscoelastic spectrometer. The storage elastic modulus is measured in a temperature dependence measuring mode in which a tensile load is applied to an adhesive cured product and its elasticity is measured at a frequency of 10 Hz and a rate of temperature rise of 5 to 10° C./minute from −50° C. to 300° C. An adhesive having a storage elastic modulus at 25° C. of more than 2,000 MPa may cause cracks because of its small effect of relaxing the stress produced at the time of reflowing due to the difference in coefficient of thermal expansion between the semiconductor chips and the printed-wiring board. On the other hand, an adhesive having a storage elastic modulus at 25° C. of less than 20 MPa may have poor handling properties.

The present invention is characterized in that the triple-layer structure making use of the heat-resistant thermoplastic film as a core material makes it easy to handle the adhesive film in spite of a difficulty because of a low modulus of elasticity at about room temperature in the adhesive of a system comprised of the epoxy-group-containing acrylic copolymer and the epoxy resin. More specifically, the triple-layer structure of the present invention can make it easy to automate operations for registration of the adhesive film having no rigidity at about room temperature, and also to exhibit a superior thermal stress relaxation effect of the present adhesive system. In the present invention, the measures as shown below have solved the problems concerning handling properties of conventional adhesive films with a low modulus of elasticity, caused by low rigidity and so forth.

1) The triple-layer structure provided with the heat-resistant thermoplastic film as a core material is employed. This makes it easy to handle the adhesive film having a low modulus of elasticity.

2) The heat-resistant thermoplastic film as specified in the present invention is used which serves as the core material. This can restrain the adhesive film from undergoing plastic deformation at the time of reflowing.

Moreover, in the present invention, the epoxy resin and the high-molecular-weight resin are well compatible with each other to become homogeneous, and the epoxy group contained in the acrylic copolymer reacts with them in part, so that the whole inclusive of unreacted epoxy resin cross-links to become a gel, hence it restrains fluidity, and by no means damages handling properties even when the epoxy resin and so forth are contained in a large quantity. Also, since the unreacted epoxy resin much remains in the gel, unreacted components ooze out of the gel when a pressure is applied. Hence, the adhesion may less decrease even when the whole has gelled.

Both the epoxy group contained in the epoxy-group-containing acrylic copolymer and the epoxy resin react when the adhesive is dried. Since the epoxy-group-containing acrylic copolymer has a large molecular weight and contains many epoxy groups in one molecular chain, the gelation takes place even when the reaction proceeds a little. Usually, the gelation takes place in the state the has been released by 10 to 40% of the total curing calorific value as measured with a DSC, i.e., at the first half stage of the A- or B-stage. Hence, the adhesive stands gelled in such a state that it contains unreacted components of the epoxy resin and so forth in a large quantity, and has come to have a greatly high melt viscosity compared with an instance where it has not gelled, so that its handling properties are by no means damaged. Also, since the unreacted components ooze out of the gel when a pressure is applied, the adhesion may less decrease even when the whole has gelled. Moreover, since the adhesive can be formed into a film in the state it contains unreacted components of the epoxy resin and so forth in a large quantity, the adhesive film has an advantage that it can have a long life (useful service life).

In conventional epoxy resin adhesives, the gelation takes place for the first time at the latter half of the B-stage and in the state of C-stage, and they contain unreacted components of the epoxy resin and so forth in a small quantity at the stage the gelation has taken place. Hence, they have a low fluidity and the unreacted components ooze out of the gel only in a small quantity even when a pressure is applied, so that they have a low adhesion.

Incidentally, the readiness of a reaction of the epoxy group contained in the acrylic copolymer and the epoxy group of the low-molecular-weight epoxy resin is unclear, but they may have at least the same level of reactivity. It is not required that only the epoxy group contained in the acrylic copolymer reacts selectively.

In this instance, the A-, B- and C-stages indicate degrees of curing of the adhesive. The A-stage is a state where it is substantially uncured and does not still gel, which is a state where its heat has been released by 0 to 20% of the total curing calorific value as measured with a DSC. The B-stage is a state where it has cured and gelled a little, which is a state where its heat has been released by 20 to 60% of the total curing calorific value. The C-stage is a state where it has cured and gelled considerably, which is a state where its heat has been released by 60 to 100% of the total curing calorific value.

To judge the extent of gelation, the adhesive is immersed in a solvent having a high permeability such as THF (tetrahydrofuran), which is then left at 25° C. for 20 hours, and thereafter the adhesive standing fully insoluble and swelled is judged to have gelled. In an experimental approach, it is judged in the following way.

The adhesive (weight W1) was immersed in THF, which was then left at 25° C. for 20 hours, and thereafter its insoluble matter was filtered with a nylon cloth of 200 meshes, and its weight after drying was measured (weight W2). THF percent extraction (%) was calculated according to the following expression (2). A sample having a THF percent extraction of more than 80% by weight was judged to have not gelled, and a sample having that of not more than 80% by weight, to have gelled.

THF percent extraction (% by weight)=(weight W1−weight W2)× 100/weight W1　　(2)

In the present invention, the addition of the filler can make the adhesive have a higher melt viscosity and also exhibit thixotropic properties. Hence, it can make the above effect greater.

In addition to the above effect, it can improve heat dissipation properties of the adhesive, and can endow the adhesive with flame retardance, with a proper viscosity at temperature at the time of bonding and also with properties to improve surface hardness.

BEST MODES FOR PRACTICING THE INVENTION

Examples of the present invention will be described below with reference to the drawings.

EXAMPLE 1

Figure 1A:
FIG. 1A is a cross-sectional view of a single-layer thermosetting adhesive film according to the present invention.

FIG. 1A is a cross-sectional view of a single-layer thermosetting adhesive film, which consists of a thermosetting adhesive 1 having as a cured product thereof a modulus of elasticity at 25° C. in the range of from 10 to 2,000 MPa and a modulus of elasticity at 260° C. prescribed in the range of from 3 to 50 MPa as measured with a dynamic viscoelastic spectrometer and being in such a semi-cured state that its heat has been released by 10 to 40% of the total curing calorific value as measured with a DSC (differential scanning calorimeter). An epoxy-group-containing acrylic copolymer film having been dried to have not more than 2% of a solvent remaining was used as the thermosetting adhesive film.

Figure 1B:
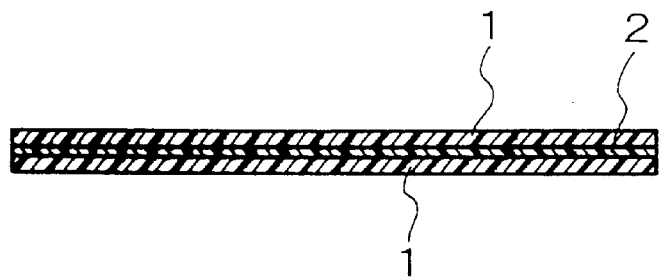
FIG. 1B is a cross-sectional view of a triple-layer adhesive film according to the present invention.

FIG. 1B illustrates a cross section of a triple-layer adhesive film comprising a polyimide film 2 on both sides of which the thermosetting adhesive 1 has been coated. In this example, UPILEX (trade name) of 50 μm thick, available from Ube Industries, Ltd., was used as the polyimide film.

Figure 2:
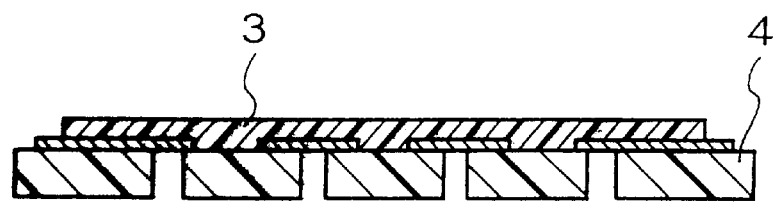
FIG. 2 is a cross-sectional view of a semiconductor mounting substrate comprising an organic wiring substrate to which an adhesive member has been thermocompression-bonded.
Figure 3:
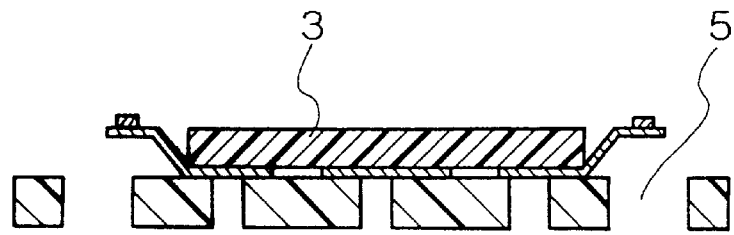
FIG. 3 is a cross-sectional view of a semiconductor mounting substrate comprising an organic wiring substrate to which an adhesive member has been thermocompression-bonded.

FIG. 2 is a cross-sectional view of a semiconductor mounting substrate comprising an organic wiring substrate 4 to which an adhesive member 3 has been thermocompression-bonded, which is suited for connecting semiconductor terminals and wiring board side terminals by wire bonding. FIG. 3 is a cross-sectional view of a semiconductor mounting substrate comprising a tape-like wiring substrate 5 to which an adhesive member 3 has been thermocompression-bonded, which is suited for connecting semiconductor terminals and wiring board side terminals by TAB inner bonding.

Figure 4:
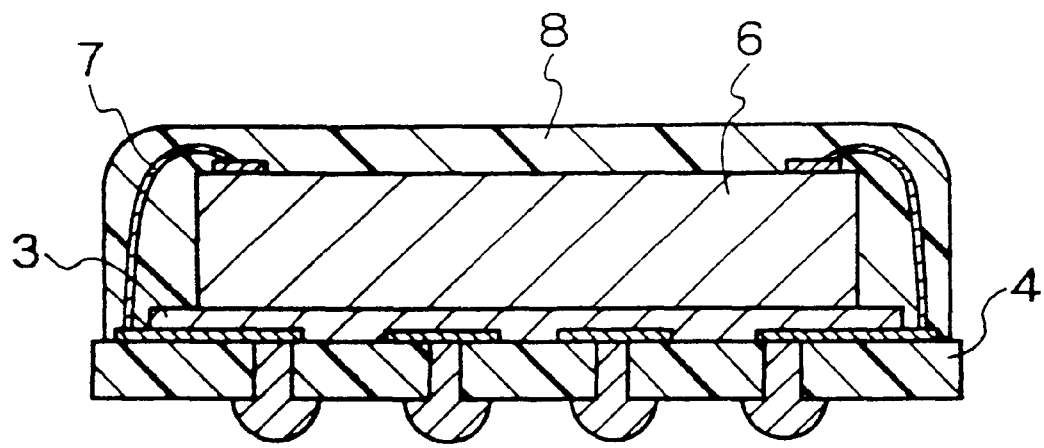
FIG. 4 is a cross-sectional view of the semiconductor device of the present invention.
Figure 5:
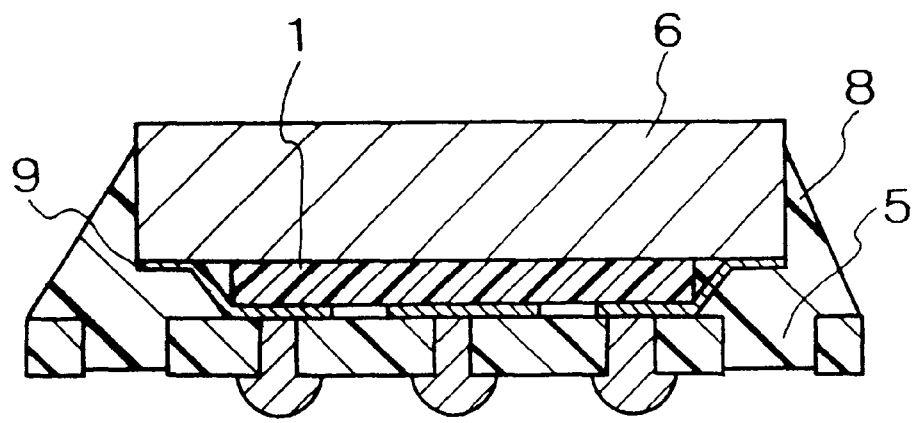
FIG. 5 is a cross-sectional view of another example of the semiconductor device of the present invention.
Figure 8:
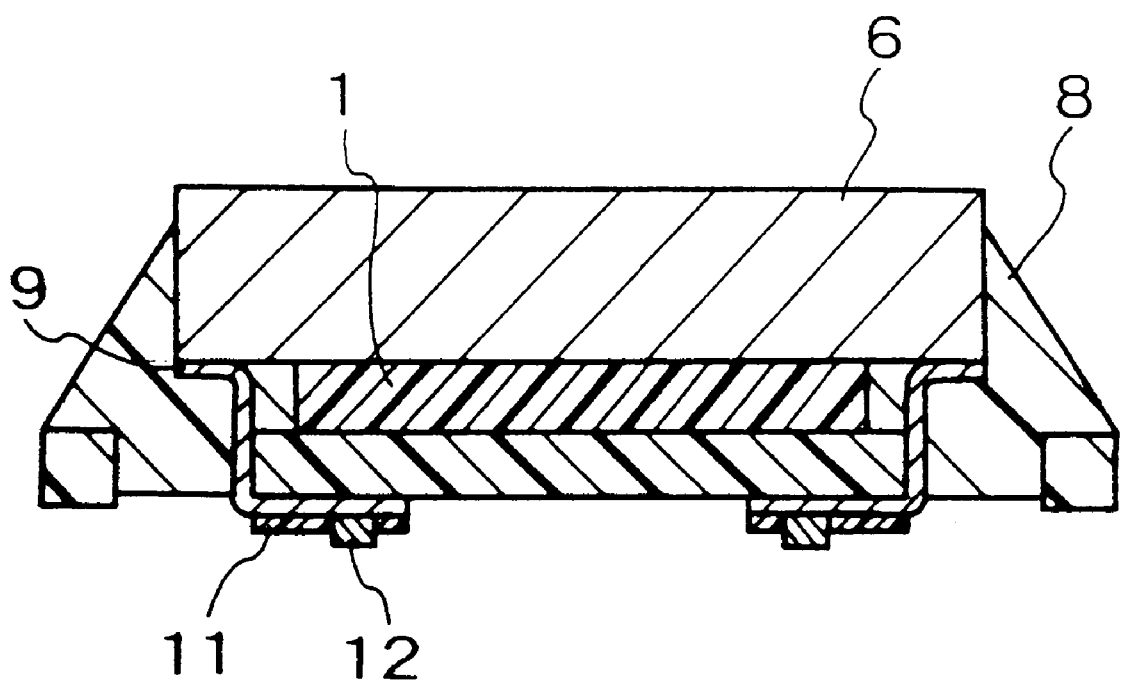
FIG. 8 is a cross-sectional view of another example of the semiconductor device of the present invention.

FIG. 4 is a cross-sectional view of a semiconductor device comprising the semiconductor mounting substrate shown in FIG. 2 and on which a chip 6 has been face-up bonded, and semiconductor terminals and wiring board side terminals have been bonded by wire bonding through wires 7 and encapsulated with an encapsulating material. FIG. 5 is a cross-sectional view of a semiconductor device comprising the semiconductor mounting substrate shown in FIG. 3 and on which a chip 6 has been face-down bonded and thereafter semiconductor terminals and wiring board side terminals have been bonded by TAB inner bonding and encapsulated with a liquid encapsulating material 8 at the perimeters of the chip 6. Wiring 9 may also be formed as shown in FIG. 8, i.e., on the side opposite to the semiconductor chip mounting side of the substrate. In this instance, external connecting terminals 12 are formed on the surface of the wiring 9 formed on the side opposite to the semiconductor chip mounting side. Also, uncovered areas of the wiring 9 are covered with resists 11.

Production steps for a semiconductor mounting substrate and a semiconductor device are shown in FIG. 6.

Figure 6A:
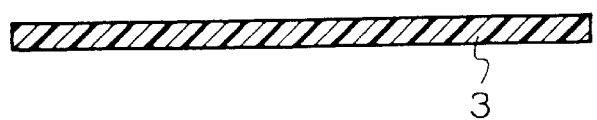
FIGS. 6A to 6F are a cross-sectional views showing production steps for a semiconductor mounting substrate and a semiconductor device according to an Example.

A thermosetting adhesive film (tape) (adhesive member) 3 constituted of a thermosetting adhesive 1 having as a cured product thereof a modulus of elasticity at 25° C. in the range of from 10 to 2,000 MPa and a modulus of elasticity at 260° C. prescribed in the range of from 3 to 50 MPa as measured with a dynamic viscoelastic spectrometer and being in such a semi-cured state that its heat has been released by 10 to 40% of the total curing calorific value as measured with a DSC, is cut in a prescribed size by means of a press cutter (FIG. 6A).

Figure 6B:
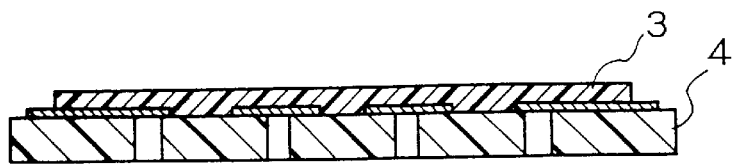
Figure 6C:
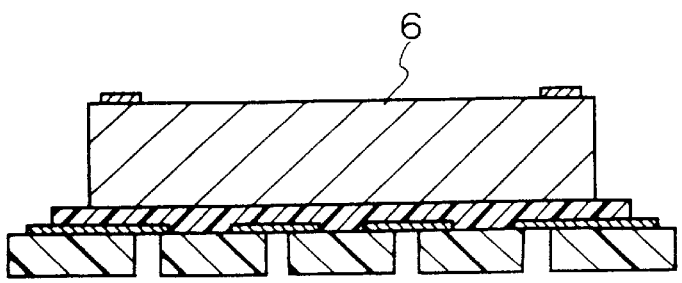
Figure 6D:
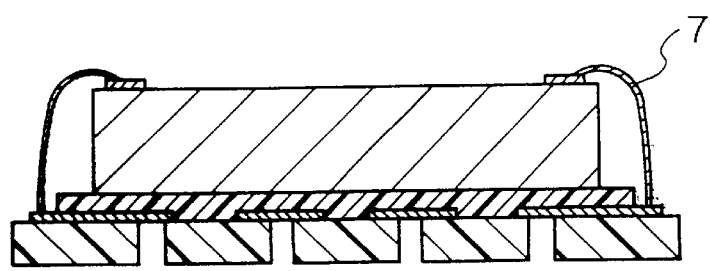

The thermosetting adhesive film (tape) 3 thus cut is positioned precisely on the top surface of a polyimide film substrate (organic wiring substrate) 4 having been provided with single-layer Cu wiring and in which through-holes for external solder terminals have been formed, and thereafter thermocompression-bonded by hot pressing to obtain a semiconductor mounting substrate (FIG. 6B).

In this example, the cutting of the thermosetting adhesive film into film pieces and the mounting and provisional fixing of them to the polyimide film substrate under precise positioning were carried out individually for each piece, and thereafter the thermosetting adhesive film pieces thus mounted were main-bonded at one time by hot pressing to obtain a seven-series framed semiconductor mounting substrate. Also, in this example, the step of static elimination to eliminate static electricity by blowing electrically charged air was carried out before the step of cutting the thermosetting adhesive film 3 to prevent the electrically charged insulating film from sticking to a jig during the cutting step. The hot press was also release-surface-treated with Teflon or silicon on its top force going to come into contact with the thermosetting adhesive film 3, in order to prevent the thermosetting adhesive film from sticking to the top force. On the multi-series semiconductor-mounting framed substrate thus obtained, a semiconductor chip 6 was face-up mounted under precise positioning, followed by pressing and bonding by hot pressing to carry out a chip-mounting step. In this example, the heating temperature on the semiconductor chip side was set higher than that of the semiconductor mounting substrate side at least, and the heat and pressure were applied on both sides.

Figure 6E:
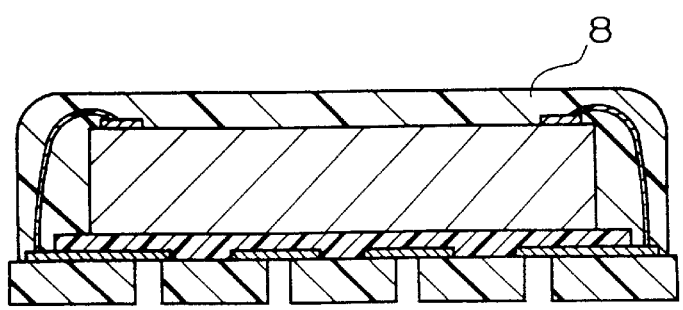
Figure 6F:
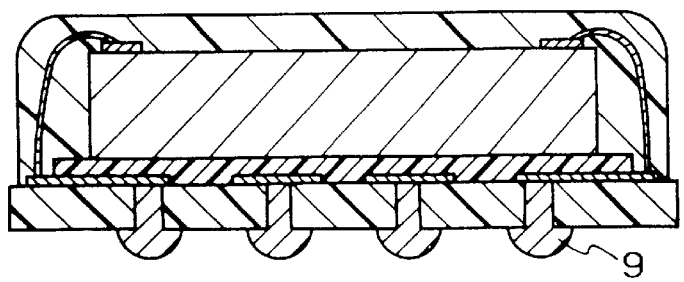

Thereafter, the step of wire-bonding the terminals on the semiconductor chip side to the terminals on the substrate side with gold wires (FIG. 6C), the step of encapsulating them by transfer molding with an epoxy type encapsulating material (FIG. 6D) and the step of forming solder balls by mounting solder balls, followed by reflowing to form external terminals 9, are carried out to obtain a semiconductor device according to the present invention (FIG. 6E). A biphenyl type epoxy encapsulating material CEL-9200 (trade name), available from Hitachi Chemical Co., Ltd., was used as the encapsulating material 8.

COMPARATIVE EXAMPLE 1

On the top surface of a polyimide film wiring substrate having been provided with single-layer Cu wiring and in which through-holes for external solder terminals have been formed (the same one as that used in Example 11), an insulating liquid adhesive composed chiefly of epoxy resin and having as a cured product thereof a modulus of elasticity at 25° C. of 3,000 MPa as measured with a DMA (dynamic viscoelastic spectrometer) was coated dropwise using a die bonding machine, and a semiconductor chip was mounted thereon under precise positioning. Then, after a prescribed curing time in a clean oven, the same wire-bonding step, encapsulating step and solder ball forming step as those in Example 1 were carried out to obtain a semiconductor device.

COMPARATIVE EXAMPLE 2

On the same substrate as that used in Example 1, an insulating liquid adhesive composed chiefly of silicon resin and having as a cured product thereof a modulus of elasticity at 25° C. of 10 MPa and a modulus of elasticity at 260° C. which was too small to be measurable was coated dropwise using a die bonding machine, and a semiconductor chip was mounted thereon. Then, the same steps as those in Example 1 were carried out to obtain a semiconductor device.

EXAMPLE 2

FIG. 7 shows production steps for a semiconductor mounting substrate and a semiconductor device.

Figure 7A:
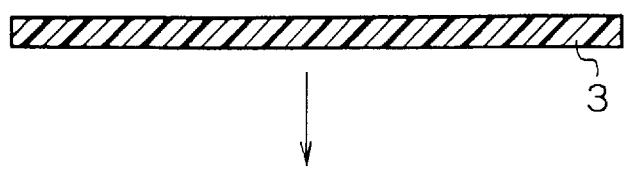
FIGS. 7A to 7F are a cross-sectional views showing production steps for a semiconductor mounting substrate and a semiconductor device according to another Example.

A thermosetting adhesive tape (adhesive member) 3 constituted of a thermosetting adhesive 1 having as a cured product thereof a modulus of elasticity at 25° C. in the range of from 10 to 2,000 MPa and a modulus of elasticity at 260° C. prescribed in the range of from 3 to 50 MPa as measured with a dynamic viscoelastic spectrometer and being in such a semi-cured state that its heat has been released by 10 to 40% of the total curing calorific value as measured with a DSC, is cut into a prescribed size using a press cutter (FIG. 7A).

Figure 7B:
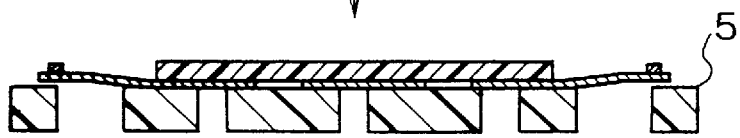

The thermosetting adhesive tape 3 thus cut is positioned precisely on the top surface of a polyimide film substrate 5 having been provided with single-layer Cu wiring and in which inner leads like those of a TAB tape and through-holes for external solder terminals have been formed, and thereafter thermocompression-bonded by hot pressing to obtain a semiconductor mounting substrate (FIG. 7B).

In this example, the step of removing static electricity before the cutting step and the step of release surface treatment on the top force surface of the hot press as described in Example 1 were repeated to obtain a multi-series semiconductor-mounting framed substrate.

Figure 7C:
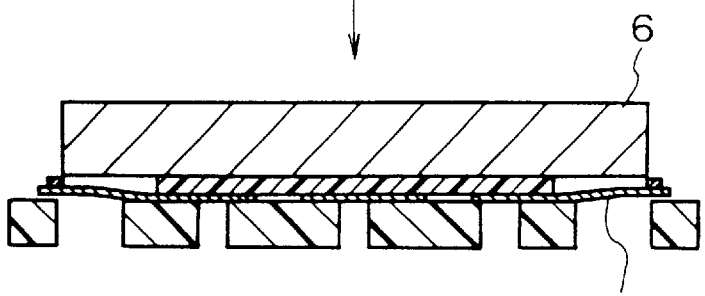
Figure 7D:
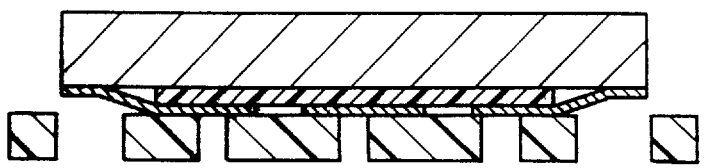
Figure 7E:
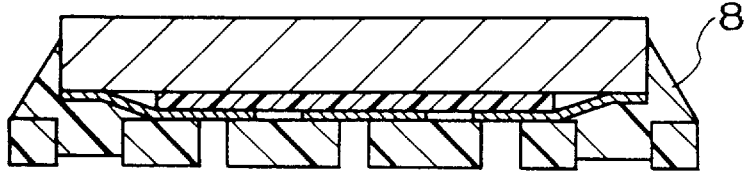
Figure 7F:
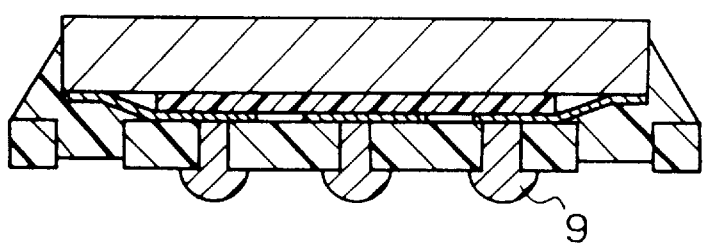

Thereafter, on the semiconductor-mounting framed substrate, a semiconductor chip 6 was face-down mounted successively under precise positioning, followed by thermocompression bonding by hot pressing (FIG. 7C). Thereafter, substrate-side terminals Cu inner leads 10 were connected individually to chip-side terminals using a TAB inner lead bonder (in this example, a single-point bonder) to carry out inner-lead bonding (FIG. 7D). Thereafter, the chip perimeter and the top surface of the polyimide film substrate 5 were coated with an epoxy type liquid encapsulating material 8 using a dispenser (FIG. 7E), followed by heating and curing for a prescribed time to obtain a semiconductor device (FIG. 7F). In this example, as the inner leads a Cu material provided thereon with Sn plating was used, and as the semiconductor terminals a material having Au-plated bumps formed was used, and these were connected by Au/Sn joining.

COMPARATIVE EXAMPLE 3

On the top surface of the same polyimide film wiring substrate as that in Example 2, having been provided with single-layer Cu wiring and in which inner leads of a TAB tape and through-holes for external solder terminals have been formed, an insulating liquid adhesive composed chiefly of epoxy resin and having as a cured product thereof a modulus of elasticity at 25° C. of 3,000 MPa as measured with a DMA was coated dropwise using a die bonding machine, and a semiconductor chip was mounted thereon under precise positioning. However, the resin flowed up to the inner bonding areas to make the subsequent inner bonding impossible, but in that state the chip perimeters were encapsulated with a liquid encapsulating material, and solder balls were formed to obtain a comparative product.

COMPARATIVE EXAMPLE 4

On the top surface of the same polyimide film wiring substrate as that in Example 2, having been provided with single-layer Cu wiring and in which inner leads of a TAB tape and through-holes for external solder terminals have been formed, an insulating liquid adhesive composed chiefly of silicon resin and having as a cured product thereof a modulus of elasticity at 25° C. of 10 MPa and a modulus of elasticity at 260° C. which was too small to be measurable was coated dropwise using a die bonding machine, and a semiconductor chip was mounted thereon in the same manner as in Example 2. However, the resin flowed up to the inner bonding areas to make the subsequent inner bonding impossible, but in that state the chip perimeters were encapsulated with a liquid encapsulating material composed chiefly of epoxy resin, and solder balls were formed to obtain a comparative product.

COMPARATIVE EXAMPLE 5

An insulating liquid adhesive composed chiefly of silicon resin and having as a cured product thereof a modulus of elasticity at 25° C. of 10 MPa and a modulus of elasticity at 260° C. which was too small to be measurable was casted on a Teflon sheet, followed by heating at a prescribed temperature for a prescribed time to effect curing to obtain a low-elasticity film. On both sides of this film, the thermosetting adhesive composed chiefly of epoxy resin as described in Comparative Example 3 was coated, and then thermocompression-bonded by hot pressing to the top surface of the same polyimide film substrate as that in Example 2, having been provided with single-layer Cu wiring and in which inner leads of a TAB tape and through-holes for external solder terminals have been formed. Thereafter, a semiconductor chip was face-down mounted, followed by the same inner lead bonding step and encapsulating step as those described in Example 2, and solder balls were formed to obtain a semiconductor device.

The semiconductor devices of Examples 1 and 2 and Comparative Examples 1 to 5 were put to a moisture-absorbed reflow test and also semiconductor devices formed by reflow packaging on FR-4 wiring substrates were put to a temperature-cycle resistance test to obtain the results as shown in Table 1. The moisture-absorbed reflow test was made by carrying out IR reflowing at a maximum temperature of 240° C. before moisture absorption and after moisture absorption for 24 hours or 48 hours under conditions of 85° C. and 85% RH, where any peeling and cracking in test samples were examined using an SAT (Scanning Acoustic Tomograph) to obtain the results shown. The temperature-cycle resistance test was made by putting each sample to temperature cycling of from −25° C. (30 minutes, air) to 150° C. (30 minutes, air) after packaging on the substrate, and thereafter measuring the connection resistance of solder balls of package external terminals by the four-terminal method. Samples showing a resistance of 50 mΩ or above were regarded as defectives.

TABLE 1

| | Reflow resistance | | | Temperature-cycle resistance | |
|---|---|---|---|---|---|
| | Initial IR | 85° C. 85% RH24h + IR | 85° C. 85% RH48h + IR | −50° C. to 150° C. 500 cycles | 1,000 cycles |
| Example 1 | A | A | A | A | A |
| Comparative Example 1 | B | B | C | A | C |
| Comparative Example 2 | C | C | C | A | A |
| Example 2 | A | A | A | A | A |
| Comparative Example 3 | C | C | C | — | — |
| Comparative Example 4 | C | C | C | — | — |
| Comparative Example 5 | B | C | C | A | A |

(Remarks)
Reflow resistance:
A: Peeling and voids very little occur at the interfaces between the chips 6 and organic wiring substrate 4 or 5 and the thermosetting adhesive 3, and are not detectable by the SAT (Scanning Acoustic Tomograph).
B: Two or three of ten samples are those in which voids are seen because the thermosetting adhesive 3 does not fill the wiring spaces of the organic wiring substrate sufficiently when it is coated, and peeling has developed from such areas.
C: Ten of ten samples are those in which the above peeling reaches as far as the outside of the package and swell and cracks are seen in the package after reflowing. Seen are those in which the peeling has led to even wire break at wire-bonded areas and inner leads.
Temperature-cycle resistance:
A: No-change in connection resistance at the solder ball connection areas is 50 mΩ or above.
—: Inner bonding is impossible and the connection resistance is not measurable, Evaluation is impossible.

EXAMPLE 3

To a composition comprising 45 parts by weight of bisphenol-A epoxy resin (epoxy equivalent weight: 200; EPIKOTE 828, available from Yuka Shell Epoxy K. K. was used) and 15 parts by weight of cresol novolak epoxy resin (epoxy equivalent weight: 220; ESCN001, available from Sumitomo Chemical Co., Ltd. was used) as the epoxy resin, and 40 parts by weight of phenol novolak resin (PLYOPHEN LF2882, available from Dainippon Ink & Chemicals, Incorporated was used) as the epoxy resin curing agent, 15 parts by weight of phenoxy resin (molecular weight: 50,000; PHENOTOHTO YP-50, available from Tohto Kasei Co., Ltd. was used) as the high-molecular-weight resin compatible with the epoxy resin and having a weight-average molecular weight of 30,000 or more, 150 parts by weight of epoxy-group-containing acrylic rubber (molecular weight: 1,000,000; HTR-860P-3, available from Teikoku Kagaku Sangyo Co., Ltd. was used) as the epoxy-group-containing acrylic copolymer, 0.5 part by weight of a curing accelerator 1-cyanoethyl-2-phenylimidazole (CUREZOLE 2PZ-CN) as the curing accelerator and 0.7 part by weight of y-glycidoxypropyltrimethoxysilane (NUC A-187, available from Nippon Unicar Co., Ltd. was used) as the silane coupling agent, methyl ethyl ketone was added and mixed with stirring, followed by vacuum deaeration. The varnish obtained was coated on a release-treated polyethylene terephthalate film of 75 μm thick, and then dried by heating at 140° C. for 5 minutes to form a coating film with a layer thickness of 80 μm and in the state of B-stage, thus an adhesive film was produced.

The degree of curing of the adhesive in this state was measured with a DSC (Model 912 DSC, manufactured by Du Pont) (rate of temperature rise: 10° C./minute). As the result, the adhesive was found to be in such a state that its heat had been released by 15% of the total curing calorific value. Also, the adhesive (weight W1) was immersed in THF, which was then left at 25° C. for 20 hours, thereafter its insoluble matter was filtered with a nylon cloth of 200 meshes, and its weight after drying was measured (weight W2). THF percent extraction, (W1−W2)×100/W1, was calculated to find that the THF percent extraction was 35% by weight. The storage elastic modulus of a cured product of the adhesive was further measured with a dynamic viscoelastic spectrometer (DVE-V4, manufactured by RHEOLOGY) (sample size: 200 mm long, 4 mm wide and 80 μm thick; rate of temperature rise: 5° C./minute; tensile mode: automatic static loading). As the result, it was found to be 360 MPa at 25° C. and 4 MPa at 260° C.

EXAMPLE 4

An adhesive film was produced in the same manner as in Example 1 except that the phenoxy resin used in Example 3 was replaced with acrylonitrile butadiene rubber containing carboxyl groups (molecular weight: 400,000; PNR-1 was used, available from Japan Synthetic Rubber Co., Ltd.). The degree of curing of the adhesive in this state was measured with the DSC. As the result, the adhesive was found to be in such a state that its heat had been released by 20% of the total curing calorific value. The THF percent extraction was 35% by weight. The storage elastic modulus of a cured product of the adhesive was further measured with the dynamic viscoelastic spectrometer. As the result, it was found to be 300 MPa at 25° C. and 3 MPa at 260° C.

EXAMPLE 5

An adhesive film was produced in the same manner as in Example 1 but using a varnish prepared by adding 10 parts by volume of silica to 100 parts by volume of the adhesive solid matter of the adhesive varnish of Example 3 followed by kneading for 60 minutes using a bead mill. As a result of the measurement with the DSC, the adhesive was found to be in such a state that its heat had been released by 15% of the total curing calorific value. The THF percent extraction was 30% by weight. The storage elastic modulus of a cured product of the adhesive was further measured with the dynamic viscoelastic spectrometer. As the result, it was found to be 1,500 MPa at 25° C. and 10 MPa at 260° C.

EXAMPLE 6

An adhesive film was produced in the same manner as in Example 1 except that the phenoxy resin used in Example 3 was not used. As a result of the measurement with the DSC, the adhesive was found to be in such a state that its heat had been released by 15% of the total curing calorific value. The THF percent extraction was 35% by weight. The storage elastic modulus of a cured product of the adhesive was further measured with the dynamic viscoelastic spectrometer. As the result, it was found to be 350 MPa at 25° C. and 4 MPa at 260° C.

COMPARATIVE EXAMPLE 6

An adhesive film was produced in the same manner as in Example 1 except that the amount of the acrylonitrile butadiene rubber used in Example 3 was changed from 150 parts by weight to 50 parts by weight. As a result of the measurement with the DSC, the adhesive was found to be in such a state that its heat had been released by 20% of the total curing calorific value. The THF percent extraction was 40% by weight. The storage elastic modulus of a cured product of the adhesive was further measured with the dynamic viscoelastic spectrometer. As the result, it was found to be 3,000 MPa at 25° C. and 5 MPa at 260° C.

COMPARATIVE EXAMPLE 7

An adhesive film was produced in the same manner as in Example 1 except that the amount of the epoxy-group-containing acrylic rubber used in Example 3 was changed from 150 parts by weight to 400 parts by weight. As a result of the measurement with the DSC, the adhesive was found to be in such a state that its heat had been released by 20% of the total curing calorific value. The THF percent extraction was 30% by weight. The storage elastic modulus of a cured product of the adhesive was further measured with the dynamic viscoelastic spectrometer. As the result, it was found to be 200 MPa at 25° C. and 1 MPa at 260° C.

COMPARATIVE EXAMPLE 8

An adhesive film was produced in the same manner as in Example 1 except that 150 parts by weight of the epoxy-group-containing acrylic rubber used in Example 3 was replaced with phenoxy resin (phenoxy resin: 160 parts by weight). The total curing calorific value of this adhesive film was 20%. The THF percent extraction was 90% by weight. The storage elastic modulus was 3,400 MPa at 25° C. and 3 MPa at 260° C.

COMPARATIVE EXAMPLE 9

An adhesive film was produced in the same manner as in Example 1 except that the epoxy-group-containing acrylic rubber used in Example 3 was replaced with acrylonitrile butadiene rubber. The total curing calorific value of this adhesive film was 20%. The THF percent extraction was 90% by weight. The storage elastic modulus was 500 MPa at 25° C. and 2 MPa at 260° C.

On semiconductor devices produced by using the adhesive films thus obtained, their thermal resistance, electrolytic corrosion resistance and moisture resistance were examined. As evaluation methods for the thermal resistance, used were reflow cracking resistance and temperature cycle tests made on semiconductor device samples each prepared by bonding, with the adhesive film, a semiconductor chip to a flexible printed-wiring board making use of a 25 μm thick polyimide film as a base material (solder balls were formed on one side). The reflow cracking resistance was evaluated by observing cracks in samples having passed through an IR (infrared) furnace whose temperature was so set that the sample surface had a maximum temperature of 240° C. and this temperature was kept for 20 seconds, and then left at room temperature to cool, this treatment being repeated. Samples having caused no cracks were evaluated as "good"; and those having caused them, as "poor". The temperature cycle test was made by leaving samples in an atmosphere of −55° C. for 30 minutes and thereafter leaving them in an atmosphere of 125° C. for 30 minutes, setting this process as one cycle, where the number of cycles until break occurred was counted.

To evaluate the electrolytic corrosion resistance, samples were prepared by forming a comb-shaped pattern of line/space =75/75 μm on the FR-4 substrate and laminating thereto the adhesive film, and their insulation resistivity was measured after leaving for 1,000 hours under conditions of application of DC 6 V in 85° C./85% RH. Those showing an insulation resistivity of 10 Ω or above were evaluated as "good"; and those of below 10 Ω, as "poor".

The moisture resistance was evaluated by observing any peeling and change in color of the adhesive film after semiconductor device samples were treated for 96 hours in a pressure cooker tester (PCT treatment). Samples in which neither peeling nor change in color was seen were evaluated as "good"; and those in which peeling or change in color was seen, as "poor".

The results are shown in Table 2.

present invention is in so large a quantity that the adhesive, though having low and good storage elastic moduli, makes handling properties of the adhesive film poor. In Comparative Example 8, the epoxy-group-containing acrylic copolymer specified in the present invention is not contained in composition, thus the adhesive has so high a storage elastic modulus that it can not relax the stress like that in Comparative Example 1, showing poor results on the reflow cracking resistance and temperature-cycle tests. In Comparative Example 9, the epoxy-group-containing acrylic copolymer specified in the present invention is not contained and other rubber component is contained, showing a low storage elastic modulus at 25° C. but resulting in a poor electrolytic corrosion resistance.

EXAMPLE 7

To a composition comprising 45 parts by weight of bisphenol-A epoxy resin (epoxy equivalent weight: 200; EPIKOTE 828, available from Yuka Shell Epoxy K. K. was used) and 15 parts by weight of cresol novolak epoxy resin (epoxy equivalent weight: 220; ESCN001, available from Sumitomo Chemical Co., Ltd. was used) as the epoxy resin, and 40 parts by weight of phenol novolak resin (PLYOPHEN LF2882, available from Dainippon Ink & Chemicals, Incorporated was used) as the epoxy resin curing agent, 15 parts by weight of phenoxy resin (molecular weight: 50,000; PHENOTOHTO YP-50, available from

TABLE 2

| Properties | Example | | | | Comparative Example | | | |
|---|---|---|---|---|---|---|---|---|
| | 3 | 4 | 5 | 6 | 6 | 7 | 8 | 9 |
| Thermal resistance: | | | | | | | | |
| Reflow cracking resistance | good | good | good | good | poor | good | poor | good |
| Temperature-cycle test (cycles) | 3,000 | 3,000 | 3,000 | 3,000 | 700 | 3,000 | 500 | 1,500 |
| Electrolytic corrosion resistance: | good | good | good | good | good | good | good | poor |
| Moisture resistance (PCT resistance): | | | | | | | | |
| Adhesion | good | good | good | good | good | good | poor | poor |
| Adhesive film handling properties | good | good | good | good | good | poor | good | good |
| Adhesive film storage elastic modulus (MPa): | | | | | | | | |
| 25° C.: | 360 | 300 | 1,500 | 350 | 3,000 | 200 | 3,400 | 500 |
| 260° C.: | 4 | 3 | 10 | 4 | 5 | 1 | 3 | 2 |
| DSC endothermic state: | 15 | 20 | 15 | 15 | 20 | 20 | 20 | 20 |
| THF percent extraction (wt. %): | 35 | 35 | 30 | 35 | 40 | 30 | 90 | 90 |

Examples 3, 4 and 5 all concerns adhesives containing the epoxy resin and curing agent thereof, the high-molecular-weight resin compatible with the epoxy resin, the epoxy-group-containing acrylic copolymer and the curing accelerator together; and Example 6, an adhesive containing the epoxy resin and curing agent thereof, the epoxy-group-containing acrylic copolymer and the curing accelerator together. Thus, they show the storage elastic moduli at 25° C. and 260° C. as specified in the present invention. These show good results on reflow cracking resistance, temperature-cycle tests, electrolytic corrosion resistance and PCT resistance.

In Comparative Example 6, the epoxy-group-containing acrylic copolymer specified in the present invention is in so small a quantity that the adhesive has too high a storage elastic modulus to relax the stress, showing poor results on reflow cracking resistance and temperature-cycle tests and having a poor reliability. In Comparative Example 7, the epoxy-group-containing acrylic copolymer specified in the Tohto Kasei Co., Ltd. was used) as the high-molecular-weight resin compatible with the epoxy resin and having a weight-average molecular weight of 30,000 or more, 150 parts by weight of epoxy-group-containing acrylic rubber (molecular weight: 1,000,000; HTR-860P-3, available from Teikoku Kagaku Sangyo Co., Ltd. was used) as the epoxy-group-containing acrylic copolymer, 0.5 part by weight of a curing accelerator 1-cyanoethyl-2-phenylimidazole (CUREZOLE 2PZ-CN) as the curing accelerator and 0.7 part by weight of y-glycidoxypropyltrimethoxysilane (NUC A-187, available from Nippon Unicar Co., Ltd. was used) as the silane coupling agent, methyl ethyl ketone was added and mixed with stirring, followed by vacuum deaeration. The varnish obtained was coated on a plasma-treated polyimide film of 50 μm thick, and then dried by heating at 130° C. for 5 minutes to form a coating film with a layer thickness of 50 μm and in the state of B-stage, thus a single-sided adhesive film was produced. Next, the same varnish as the above was coated on the polyimide film of this single-sided adhesive film on its side where the adhesive is not coated, and then dried by heating at 140° C. for 5 minutes to form a coating film with a layer thickness of 50 μm and in the state of B-stage, thus a double-sided adhesive film having a triple-layer structure was produced.

The degree of curing of the adhesive component of the adhesive film in this state was measured with a DSC (Model 912 DSC, manufactured by Du Pont) (rate of temperature rise: 10° C./minute). As the result, the adhesive component was found to be in such a state that its heat had been released by 15% of the total curing calorific value. Also, the adhesive (weight W1) was immersed in THF, which was then left at 25° C. for 20 hours, thereafter its insoluble matter was filtered with a nylon cloth of 200 meshes, and its weight after drying was measured (weight W2). THF percent extraction, (W1−W2)×100/W1, was calculated to find that the THF percent extraction was 35% by weight. The storage elastic modulus of a cured product of the adhesive was further measured with a dynamic viscoelastic spectrometer. As the result, it was found to be 360 MPa at 25° C. and 4 MPa at 260° C.

EXAMPLE 8

A double-sided adhesive film of triple-layer structure was produced in the same manner as in Example 1 except that the phenoxy resin used in Example 7 was replaced with acrylonitrile butadiene rubber containing carboxyl groups (molecular weight: 400,000; PNR-1, available from Japan Synthetic Rubber Co., Ltd. was used). The degree of curing of the adhesive component of the adhesive film in this state was measured with the DSC. As the result, the adhesive component was found to be in such a state that its heat had been released by 20% of the total curing calorific value. The THF percent extraction was 35% by weight. The storage elastic modulus of a cured product of the adhesive was further measured with the dynamic viscoelastic spectrometer. As the result, it was found to be 300 MPa at 25° C. and 3 MPa at 260° C.

EXAMPLE 9

The adhesive varnish as used in Example 7 was coated on a polyethylene terephthalate film of 50 μm thick, and then dried by heating at 140° C. for 5 minutes to form a coating film with a layer thickness of 50 μm and in the state of B-stage, thus an adhesive film to be laminated to a core material heat-resistant thermoplastic film was produced. This adhesive film was laminated to both sides of a plasma-treated polyimide film of 50 μm thick using a vacuum laminator under lamination conditions of a laminator roll temperature of 80° C., a feed rate of 0.2 m/minute and a linear pressure of 5 kg to produce a double-sided adhesive film of triple-layer structure.

The degree of curing of the adhesive component of the adhesive film in this state was measured with a DSC. As the result, the adhesive component was found to be in such a state that its heat had been released by 20% of the total curing calorific value. The THF percent extraction was 35% by weight. The storage elastic modulus of a cured product of the adhesive was further measured with the dynamic viscoelastic spectrometer. As the result, it was found to be 360 MPa at 25° C. and 4 MPa at 260° C.

COMPARATIVE EXAMPLE 10

The adhesive varnish as used in Example 7 was coated on a polyethylene terephthalate film of 50 μm thick, and then dried by heating at 140° C. for 5 minutes to form a coating film with a layer thickness of 75 μm and in the state of B-stage, thus an adhesive film was produced. Using two sheets of this adhesive film, these were laminated under the same lamination conditions as in Example 3, thus a double-layer adhesive film was produced. The total curing calorific value of the adhesive component of the adhesive film thus obtained was 20%. The THF percent extraction was 35% by weight. The storage elastic modulus was 360 MPa at 25° C. and 4 MPa at 260° C.

COMPARATIVE EXAMPLE 11

A double-sided adhesive film of triple-layer structure was produced in the same manner as in Example 1 except that the polyimide film used as a core material heat-resistant thermoplastic film in Example 7 was replaced with polypropylene film. The total curing calorific value of the adhesive component of this adhesive film was 20%. The THF percent extraction was 35% by weight. The storage elastic modulus as 360 MPa at 25° C. and 4 MPa at 260° C.

COMPARATIVE EXAMPLE 12

A double-sided adhesive film of triple-layer structure was produced in the same manner as in Example 1 except that the epoxy-group-containing acrylic copolymer used in Example 7 was replaced with phenoxy resin (phenoxy resin: 165 parts by weight). The total curing calorific value of the adhesive component of this adhesive film was 20%. THF percent extraction was 90% by weight. The storage elastic modulus was 3,400 MPa at 25° C. and 3 MPa at 260° C.

COMPARATIVE EXAMPLE 13

A double-sided adhesive film of triple-layer structure was produced in the same manner as in Example 1 except that the epoxy-group-containing acrylic copolymer used in Example 7 was replaced with acrylonitrile butadiene rubber. The total curing calorific value of the adhesive component of this adhesive film was 20%. The THF percent extraction was 90% by weight. The storage elastic modulus was 500 MPa at 25° C. and 2 MPa at 260° C.

On the adhesive films thus obtained, their thermal resistance, electrolytic corrosion resistance and moisture resistance were examined. As evaluation methods for the thermal resistance, used were reflow cracking resistance and temperature cycle tests made on samples each prepared by bonding semiconductor chips to a printed-wiring board with the double-sided adhesive film of triple-layer structure. The reflow cracking resistance was evaluated by observing cracks in samples having passed through an IR furnace whose temperature was so set that the sample surface had a maximum temperature of 240° C. and this temperature was kept for 20 seconds, and then left at room temperature to cool, this treatment being repeated. Samples having caused no cracks were evaluated as "good"; and those having caused them, as "poor". The temperature cycle test was made by leaving samples in an atmosphere of −55° C. for 30 minutes and thereafter leaving them in an atmosphere of 125° C. for 30 minutes, setting this process as one cycle, where the number of cycles until break occurred was counted.

To evaluate the electrolytic corrosion resistance, samples were prepared by forming a comb-shaped pattern of line/space=75/75 μm on the FR-4 substrate and laminating thereto the adhesive film, and their insulation resistivity was measured after leaving for 1,000 hours under conditions of application of DC 6 V in 85° C./85%RH. Those showing an insulation resistivity of 10 Ω or above were evaluated as "good"; and those of below 10 Ω, as "poor".

The moisture resistance was evaluated by observing any peeling and change in color of the adhesive film after the thermal resistance evaluation samples were treated for 96 hours in a pressure cooker tester (PCT treatment). Samples in which neither peeling nor change in color was seen were evaluated as "good"; and those in which peeling or change in color was seen, as "poor".

The results are shown in Table 3.

TABLE 3

| Properties | Example | | | Comparative Example | | | |
|---|---|---|---|---|---|---|---|
|  | 7 | 8 | 9 | 10 | 11 | 12 | 13 |
| Handling properties: | good | good | good | poor | good | good | good |
| Thermal resistance: |  |  |  |  |  |  |  |
| Reflow cracking resistance | good | good | poor | good | poor | poor | good |
| Temperature-cycle test (cycles) | 3,000< | 3,000< | 3,000< | 3,000< | 1,000 | 500 | 1,500 |
| Electrolytic corrosion resistance: | good | good | good | good | good | good | poor |
| Moisture resistance (PCT resistance): | good | good | good | good | good | poor | poor |
| Adhesive component storage elastic modulus (MPa): |  |  |  |  |  |  |  |
| 25° C.: | 360 | 300 | 360 | 360 | 360 | 3 400 | 500 |
| 260° C.: | 4 | 3 | 4 | 4 | 4 | 3 | 2 |

Examples 7, 8 and 9 all concerns double-sided adhesive film of triple-layer structure making use of the heat-resistant thermoplastic film as a core material and containing as adhesive components the epoxy resin and curing agent thereof, the high-molecular-weight resin compatible with the epoxy resin and the epoxy-group-containing acrylic copolymer together. Thus, they show the storage elastic moduli at 25° C. and 260° C. as specified in the present invention. These have good handling properties and show good results on reflow cracking resistance, temperature-cycle tests, electrolytic corrosion resistance and PCT resistance.

In Comparative Example 10, the adhesive film is not the double-sided adhesive film of triple-layer structure making use of the heat-resistant thermoplastic film as a core material, and hence have poor handling properties. In Comparative Example 11, the polypropylene film, having a poor thermal resistance, is used as the core material, and hence show poor results on reflow cracking resistance and temperature-cycle tests. In Comparative Example 12, the epoxy-group-containing acrylic copolymer specified in the present invention is not contained in composition, thus the adhesive shows a higher value than the specified storage elastic modulus at 25° C., showing poor results on reflow cracking resistance and temperature-cycle tests. In Comparative Example 13, the epoxy-group-containing acrylic copolymer specified in the present invention is not contained but the storage elastic modulus at 25° C. is adjusted to the one specified in the present invention, showing poor results on electrolytic corrosion resistance and PCT resistance.

POSSIBILITY OF INDUSTRIAL APPLICATION

The present invention makes it possible to produce semiconductor packages having superior moisture-absorbed reflow resistance and also having temperature-cycle resistance in the state they are mounted on mother boards.

The adhesive and adhesive film of the present invention have a low modulus of elasticity at about room temperature, and hence can relax thermal stress produced at the time of heating and cooling because of a difference in coefficient of thermal expansion when semiconductor chips are mounted on rigid printed-wiring boards and flexible printed-wiring board as typified by glass epoxy substrates and polyimide substrates. Hence, they can be free from occurrence of cracks at the time of reflowing and have superior thermal resistance. Also, they contain the epoxy-group-containing acrylic copolymer as a component providing a low modulus of elasticity, and can provide adhesive materials that have superior features for electrolytic corrosion resistance and moisture resistance, in particular, may cause less deterioration when moisture resistance is tested under severe conditions such as PCT treatment.

The double-sided adhesive film of triple-layer structure of the present invention, making use of the heat-resistant thermoplastic film as a core material, although its adhesive layer has a low modulus of elasticity at about room temperature, has superior handling properties and also can relax thermal stress produced at the time of heating and cooling because of a difference in coefficient of thermal expansion when semiconductor chips are packaged on rigid printed-wiring boards and flexible printed-wiring board as typified by glass epoxy substrates and polyimide substrates. Hence, it can be free from occurrence of cracks at the time of reflowing and have superior thermal resistance. Also, it contains the epoxy-group-containing acrylic copolymer as a component providing a low modulus of elasticity, and can provide adhesive materials that have superior features for electrolytic corrosion resistance and moisture resistance, in particular, may cause less deterioration when moisture resistance is tested under severe conditions such as PCT treatment.

The semiconductor package in which external terminals are arranged in area array on the back of the substrate is especially suited when mounted in portable instruments or PDA-purpose compact electronic instruments.

What is claimed is:

1. A curable adhesive, wherein a cured form of the adhesive has a storage elastic modulus at 25° C. of from 10 to 2,000 MPa and a storage elastic modulus at 260° C. of from 3 to 50 MPa as measured with a dynamic viscoelastic spectrometer.

2. An adhesive according to claim 1, comprising an epoxy resin and a curing agent thereof.

3. An adhesive according to claim 2, wherein said epoxy resin comprises:
   a liquid bifunctional epoxy resin having a molecular weight of 5000 or less; and/or
   a solid polyfunctional epoxy resin.

4. An adhesive according to claim 2, further comprising a high-molecular-weight resin compatible with said epoxy resin and having a weight-average molecular weight of 30,000 or more.

5. An adhesive according to claim 2, further comprising an epoxy group-containing acrylic copolymer containing from 2 to 6% by weight of glycidyl (meth)acrylate and having a Tg (glass transition temperature) of −10° C. or above and a weight-average molecular weight of 800,000 or more.

6. A method for adhering a semiconductor chip to an organic substrate, which comprises adhering a semiconductor chip to an organic substrate using the adhesive of claim 2.

7. A method for adhering a semiconductor chip to an organic substrate, which comprises adhering a semiconductor chip to an organic substrate using the adhesive of claim 1.

8. A semiconductor device comprising an organic substrate and a semiconductor chip mounted on said organic substrate via said adhesive according to claim 1.

9. A semiconductor device according to claim 8, wherein wiring is provided at least on a top or a back surface of said organic substrate.

10. A film comprising a curable adhesive wherein a cured form of the adhesive has a storage elastic modulus at 25° C. of from 10 to 2,000 MPa and a storage elastic modulus at 260° C. of from 3 to 50 MPa as measured with a dynamic viscoelastic spectrometer.

11. An adhesive film according to claim 10, wherein said adhesive film has a residual solvent content of not more than 5% by weight.

12. The film according to claim 10 that is in a partially cured state, wherein the degree of curing is correlated to a release of heat from the adhesive during said partial curing, said heat being detected by a differential scanning calorimeter, and wherein said partially cured state is correlated to a heat release of 10 to 40% of the total calorific value of the adhesive.

13. An adhesive film according to claim 10, comprising an epoxy resin and a curing agent thereof.

14. An adhesive film according to claim 13, wherein said epoxy resin comprises:

a liquid bifunctional epoxy resin having a molecular weight of 5000 or less; and/or a solid polyfunctional epoxy resin.

15. An adhesive film according to claim 13, further comprising a high-molecular-weight resin compatible with said epoxy resin and having a weight-average molecular weight of 30,000 or more.

16. A method for adhering a semiconductor chip to an organic substrate, which comprises adhering a semiconductor chip to an organic substrate using the adhesive film of claim 13.

17. A method for adhering a semiconductor chip to an organic substrate, which comprises adhering a semiconductor chip to an organic substrate using the adhesive film of claim 10.

18. A semiconductor device comprising an organic substrate and a semiconductor chip mounted on said organic substrate via said adhesive film according to claim 10.

19. A semiconductor device according to claim 18, wherein wiring is provided at least on a top or a back surface of said organic substrate.

20. A double-sided adhesive film comprising: a core film material having two surfaces; and an adhesive provided on said surfaces of said core film material; said adhesive, as a cured product thereof, having: a storage elastic modulus at 25° C. of from 10 to 2,000 MPa and a storage elastic modulus at 260° C. of from 3 to 50 MPa as measured with a dynamic viscoelastic spectrometer.

21. A double-sided adhesive film according to claim 20, wherein said core material is a heat-resistant thermoplastic film.

22. A double-sided adhesive film according to claim 20 wherein said core material comprises at least one selected from a polyimide, polyether sulfone, polyamide-imide and polyether-imide each having a glass transition temperature of 200° C. or more.

23. A double-sided adhesive film according to claim 20, being such a state that its heat has been released by 10 to 40% of its total curing calorific value as measured with a differential scanning calorimeter.

24. A double-sided adhesive film according to claim 20, wherein said adhesive film has a residual solvent content of not more than 5% by weight.

25. A double-sided adhesive film according to claim 20, comprising an epoxy resin and a curing agent thereof.

26. A double-sided adhesive film according to claim 25, wherein said epoxy resin comprises:

a liquid bifunctional epoxy resin having a molecular weight of 5000 or less; and/or a solid polyfunctional epoxy resin.

27. A method for adhering a semiconductor chip to an organic substrate which comprises adhering a semiconductor chip to an organic substrate using the double-sided adhesive of claim 20.

28. A semiconductor device comprising an organic substrate and a semiconductor chip mounted on said organic substrate via said double-sided adhesive film according to claim 20.

29. A semiconductor device according to claim 28, wherein wiring is provided at least on a top or a back surface of said organic substrate.

* * * * *